US011138927B2

(12) United States Patent
Jung et al.

(10) Patent No.: US 11,138,927 B2
(45) Date of Patent: Oct. 5, 2021

(54) ELECTRONIC DEVICE HAVING DISPLAY

(71) Applicant: SAMSUNG ELECTRONICS CO., LTD., Suwon-si (KR)

(72) Inventors: Songhee Jung, Suwon-si (KR); Seungjun Hyun, Seoul (KR); Minsik Kim, Yongin-si (KR); Min-Sung Lee, Suwon-si (KR); Mooyoung Kim, Seoul (KR); Kihuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/983,986

(22) Filed: Aug. 3, 2020

(65) Prior Publication Data

US 2020/0380914 A1    Dec. 3, 2020

Related U.S. Application Data

(63) Continuation of application No. 16/087,309, filed as application No. PCT/KR2017/003169 on Mar. 24, 2017, now Pat. No. 10,733,931.

(30) Foreign Application Priority Data

Mar. 24, 2016    (KR) .................. 10-2016-0035280
Feb. 24, 2017    (KR) .................. 10-2017-0024685

(51) Int. Cl.
*G09G 3/3208*    (2016.01)
*H01L 51/56*    (2006.01)
(Continued)

(52) U.S. Cl.
CPC ......... *G09G 3/3208* (2013.01); *G09G 3/2003* (2013.01); *G09G 5/377* (2013.01);
(Continued)

(58) Field of Classification Search
CPC .... G06F 1/1686; G06F 1/1637; G06F 1/1626; G06F 3/0412; G06F 3/044; G06F 3/041;
(Continued)

(56) References Cited

U.S. PATENT DOCUMENTS 8,947,627 B2 *  2/2015  Rappoport ............ G06F 1/1698
                                                    349/151
9,131,135 B2    9/2015  Jarvis et al.
(Continued)

FOREIGN PATENT DOCUMENTS

KR    10-2012-0043004    5/2012
KR    10-2013-0018878    2/2013
(Continued)

OTHER PUBLICATIONS

International Search Report for PCT/KR2017/003169, dated Jul. 10, 2017, 4 pages.
(Continued)

*Primary Examiner* — Koosha Sharifi-Tafreshi
(74) *Attorney, Agent, or Firm* — Nixon & Vanderhye, P.C.

(57) ABSTRACT

Disclosed in the present invention is a device comprising: a housing including a first surface facing a first direction and a second surface facing a second direction; a transparent cover formed on at least a portion of the first surface of the housing; a display disposed between the transparent cover and the second surface; a sensor disposed between the display and the second surface; and a control circuit, electrically connected to the sensor, for controlling the sensor, wherein the display can comprise: a first region including a plurality of pixels capable of displaying color; and a second region aligned on at least a portion of the sensor such that
(Continued)

light acquired from the outside of the electronic device passes through the sensor. The present invention can have various examples.

14 Claims, 39 Drawing Sheets

(51) Int. Cl.
| | |
|---|---|
| *G09G 5/377* | (2006.01) |
| *H01L 27/32* | (2006.01) |
| *G09G 3/20* | (2006.01) |
| *H01L 51/00* | (2006.01) |
| *H01L 51/52* | (2006.01) |
| *G06F 3/01* | (2006.01) |
| *G06F 3/041* | (2006.01) |
| *G06K 9/00* | (2006.01) |

(52) U.S. Cl.
CPC .......... *H01L 27/32* (2013.01); *H01L 27/3225* (2013.01); *H01L 27/3276* (2013.01); *H01L 51/0097* (2013.01); *H01L 51/524* (2013.01); *H01L 51/56* (2013.01); *G06F 3/017* (2013.01); *G06F 3/041* (2013.01); *G06F 2203/04108* (2013.01); *G06K 9/0004* (2013.01); *G09G 2300/046* (2013.01); *G09G 2300/0426* (2013.01); *G09G 2300/0439* (2013.01); *G09G 2300/0456* (2013.01); *G09G 2320/0686* (2013.01); *G09G 2340/10* (2013.01); *G09G 2360/144* (2013.01); *G09G 2380/02* (2013.01); *H01L 2251/5338* (2013.01)

(58) Field of Classification Search
CPC .................. G06F 1/1605; G06F 1/1643; G06F 2203/04108; G06F 1/169; G06F 3/042; G06F 3/0416; G06F 3/017; G09G 2360/144; G09G 2300/0426; G09G 2320/0626; G09G 3/3208; G09G 3/3225; G09G 3/20; G09G 2354/00; G09G 2300/0439; G09G 2380/02; G09G 2340/0407; G09G 5/377; G09G 3/2003; G09G 2320/0686; G09G 2340/10; G09G 2300/046; G09G 2300/0456; H01L 27/323; H01L 27/3227; H01L 51/0097; H01L 27/3276; H01L 27/3234; H01L 2251/5338; H01L 27/326; H01L 51/56; H01L 27/32; H01L 27/3225; H01L 51/524; H04N 5/2257; H04N 5/2254; G06K 9/0004; Y02E 10/549

See application file for complete search history.

(56) References Cited

U.S. PATENT DOCUMENTS

| | | |
|---|---|---|
| 2004/0263670 A1 | 12/2004 | Yamasaki |
| 2006/0158588 A1 | 7/2006 | Uh |
| 2009/0051636 A1 | 2/2009 | Natori |
| 2009/0141116 A1 | 6/2009 | Kanade |
| 2010/0201275 A1 | 8/2010 | Cok et al. |
| 2010/0273530 A1 | 10/2010 | Jarvis |
| 2010/0315570 A1 | 12/2010 | Mathew |
| 2011/0043435 A1 | 2/2011 | Hebenstreit et al. |
| 2012/0258773 A1 | 10/2012 | Alvarez Rivera et al. |
| 2013/0076712 A1 | 3/2013 | Zheng |
| 2013/0094126 A1 | 4/2013 | Rappoport |
| 2013/0135268 A1 | 5/2013 | Kanade et al. |
| 2013/0135328 A1* | 5/2013 | Rappoport ............ G06F 3/0481 345/522 |
| 2013/0141481 A1 | 6/2013 | Peng et al. |
| 2013/0141639 A1 | 6/2013 | Kim et al. |
| 2013/0188305 A1 | 7/2013 | Mathew et al. |
| 2013/0335453 A1 | 12/2013 | Lim et al. |
| 2013/0342428 A1 | 12/2013 | Liu |
| 2014/0306288 A1 | 10/2014 | Adachi et al. |
| 2015/0200236 A1 | 7/2015 | Kim et al. |
| 2015/0301782 A1 | 10/2015 | Kim |
| 2015/0303407 A1 | 10/2015 | Baek et al. |
| 2016/0337570 A1 | 11/2016 | Tan |
| 2017/0084231 A1 | 3/2017 | Chew |
| 2017/0102809 A1 | 4/2017 | Son |
| 2017/0123454 A1 | 5/2017 | Evans |

FOREIGN PATENT DOCUMENTS

| | | |
|---|---|---|
| KR | 10-2013-0061539 | 6/2013 |
| KR | 10-2013-0141293 | 12/2013 |
| KR | 10-2014-0022224 | 2/2014 |
| KR | 10-1526783 | 6/2015 |
| KR | 10-2015-0084241 | 7/2015 |
| KR | 10-2015-0119996 | 10/2015 |
| KR | 10-2191707 | 12/2020 |

OTHER PUBLICATIONS

Written Opinion of the ISA for PCT/KR2017/003169, dated Jul. 10, 2017, 6 pages.
Extended Search Report dated Dec. 4, 2018 in counterpart European Patent Application No. EP17770650.4.
Communication pursuant to Article 94(3) dated May 28, 2020 in counterpart EP Application No. 17770650.4.
Jung et al., U.S. Appl. No. 16/087,309, filed Sep. 21, 2018.
Extended Search Report dated Jun. 18, 2021 in counterpart European Patent Application No. EP21164722.7.

\* cited by examiner

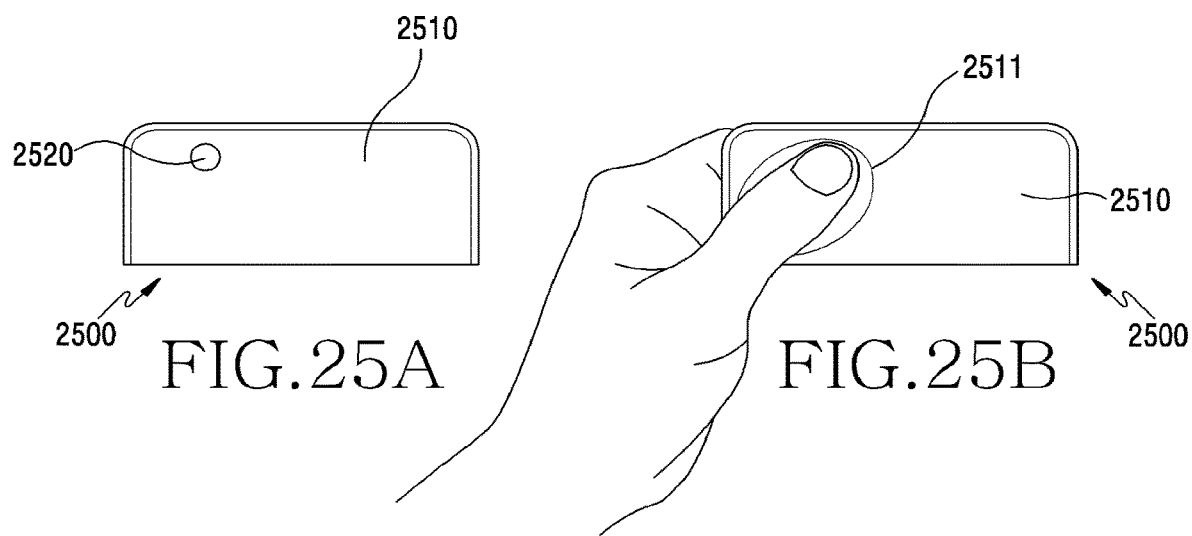

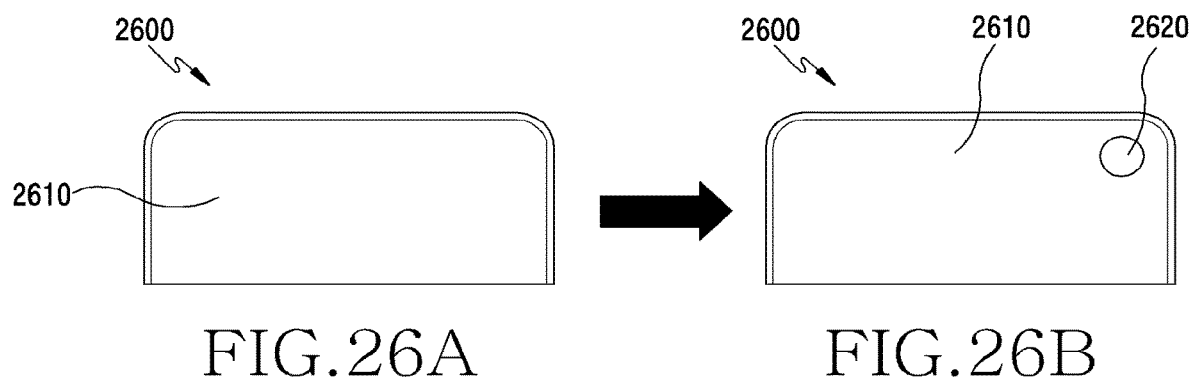

ELECTRONIC DEVICE HAVING DISPLAY

CROSS-REFERENCE TO RELATED APPLICATIONS

This application is a continuation of U.S. application Ser. No. 16/087,309, filed Sep. 21, 2018, now U.S. Pat. No. 10,733,931, which is the U.S. national phase of International Application No. PCT/KR2017/003169 filed Mar. 24, 2017, which designated the U.S. and claims priority to KR Patent Application No. 10-2016-0035280 filed Mar. 24, 2016, and KR Patent Application No. 10-2017-0024685 filed Feb. 24, 2017. The entire contents of each of these applications are hereby incorporated by reference.

TECHNICAL FIELD

Various embodiments of the present disclosure relate to an electronic device having a display.

BACKGROUND ART

An electronic device such as an ordinary smart phone may include at least one display. The display is a data output device, and is capable of displaying input data. Further, the display may be provided with a touch sensitive panel so as to operate as a touch screen.

Such a display is usually mounted as a large screen on the front face of the electronic device. For example, an ordinary organic light-emitting display (OLED) may be a self-emission-type display device which includes an organic light-emitting element including an organic light emitting layer, and which generates light when an exciton, which is generated as a hole injected from the hole injection electrode and an electron injected from an electron injection electrode are coupled to each other in the organic light-emitting layer, falls from an excited state to a ground state.

Since an organic light-emitting display device, which is a self-emission type display device, does not require a separate light source, the organic light-emitting display device can be driven at a low voltage and can be configured in a lightweight and thin type. Further, the organic light-emitting display device is excellent in characteristics such as a viewing angle, contrast, and response speed, the application range thereof is expanding from a personal electronic device such as an MP3 player to a television (TV).

The above-described organic light-emitting display device may be employed on the front face of an electronic device so as to display various pieces of information.

However, the display employed on the front face of the electronic device has to employ functional components such as a home key, a sensor, a front camera, and the like, and these functional components are disposed in a non-display area. Therefore, there is a limitation in maximizing the area of the display mounted on the front face of the electronic device.

SUMMARY

Various embodiments of the present disclosure are capable of providing an electronic device, the front face of which is configured as a display area.

Various embodiments of the present disclosure are capable of providing an electronic device in which the display area is disposed so as to be closely wrapped by a rim.

Various embodiments of the present disclosure are capable of providing an electronic device that maximizes the display area by placing components on the rear face of the display.

Various embodiments of the present disclosure are capable of providing an electronic device having a display, which includes a first display area having a first pixel density and a second display area located within the first display area and having a second pixel density different from the first pixel density.

Various embodiments of the present disclosure are capable of providing an electronic device having a display, which includes a first display area having a first pixel density and a transparent second display area located within the first display area.

Various embodiments of the present disclosure are capable of providing an electronic device having an optical structure capable of correcting an image displayed on a second display.

Various embodiments of the present disclosure provide an electronic device that may include: a printed circuit board; a display having one or more display areas and disposed on the print circuit board; and a component mounted on the printed circuit board, and disposed below the display area. The display may include a first display area structure having a first pixel density; and a second display area structure having a second pixel density different from the first pixel density.

Various embodiments of the present disclosure provide an electronic device that may include: a printed circuit board; a display having one or more display areas and disposed on the print circuit board; and a component mounted on the printed circuit board and disposed at a location that does not overlap the display. The display may include a first display area structure having a pixel density and a second display area structure not having a pixel density.

In an electronic device according to various embodiments of the present disclosure, it is possible to configure the entire front face of an electronic device as a front display area.

In an electronic device according to various embodiments of the present disclosure, it is possible to maximize the display area by disposing the components related to the front face of a display on the rear face of the display.

In an electronic device according to various embodiments of the present disclosure, it is possible to provide various UI/UX environments by providing a first display area having a first pixel density and a second display area located within the first display area and having a second pixel density different from the first pixel density.

BRIEF DESCRIPTION OF THE DRAWINGS

FIGS. 25A and 25B are exemplary views illustrating a state of displaying an image related to the first display area around the second display area according to various embodiments of the present disclosure;

FIGS. 26A and 26B are exemplary views illustrating a state at the time of creating a transparent second display area according to various embodiments of the present disclosure;

DETAILED DESCRIPTION OF EXAMPLE EMBODIMENTS

Figure 1:
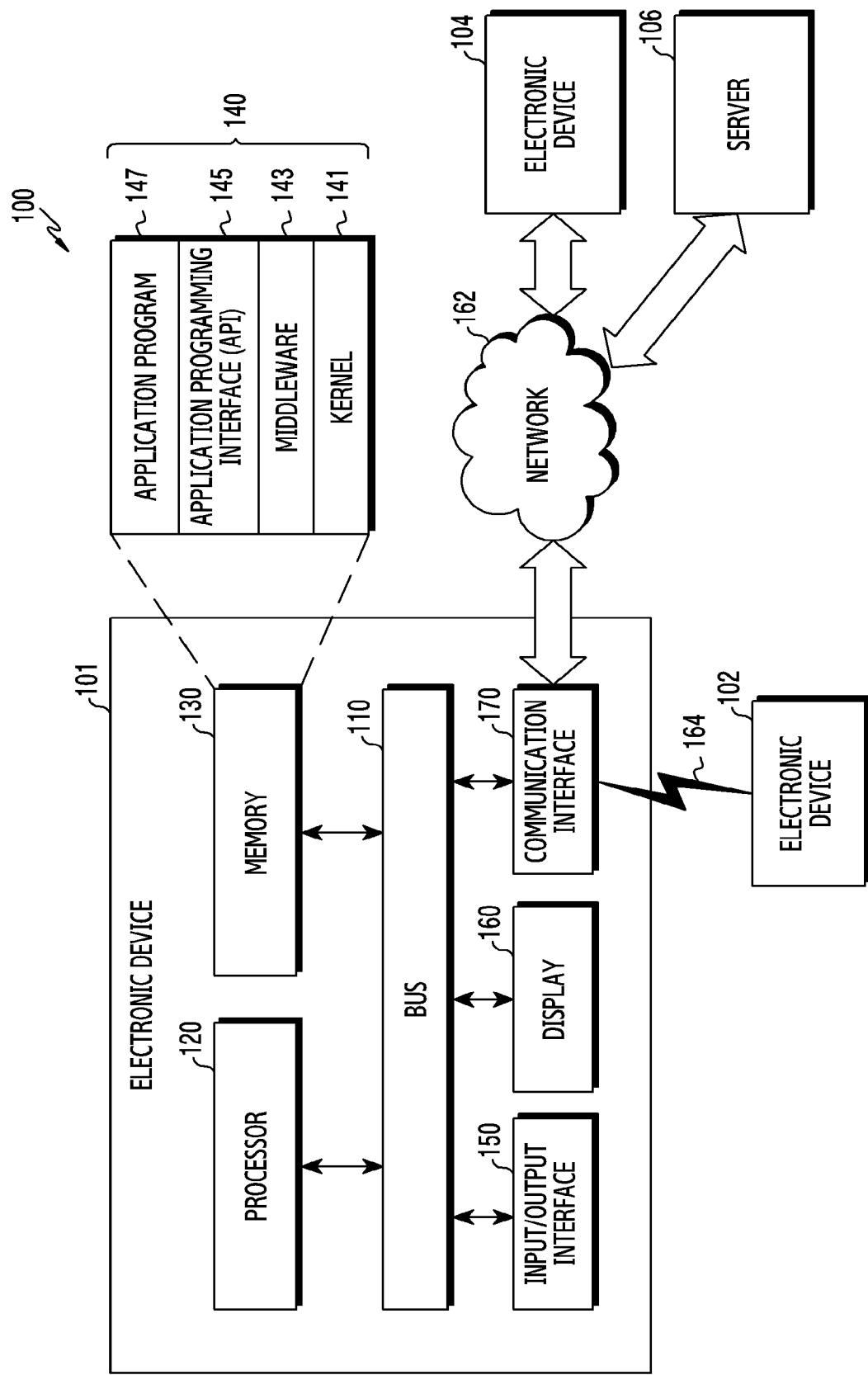
FIG. 1 is a diagram illustrating an electronic device 101 in a network environment according to various embodiments of the present disclosure.

Hereinafter, various embodiments of the present invention will be described with reference to accompanying drawings. However, various embodiments of the present invention are not limited to specific embodiments, and it should be understood that modification, equivalent, and/or alternative on the various embodiments described herein can be variously made. With regard to description of drawings, similar components may be marked by similar reference numerals.

In the disclosure disclosed herein, the expressions "have," "may have," "include" and "comprise," or "may include" and "may comprise" used herein indicate existence of corresponding features (for example, elements such as numeric values, functions, operations, or components) and do not preclude the presence of additional features.

In the disclosure disclosed herein, the expressions "A or B," "at least one of A or/and B," or "one or more of A or/and B," and the like used herein may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used herein, may refer to various elements of various embodiments of the present invention, but do not limit the elements. For example, such terms do not limit the order and/or priority of the elements. Furthermore, such terms may be used to distinguish one element from another element. For example, "a first user device" and "a second user device" indicate different user devices regardless of the order or priority. For example, without departing from the scope of the present invention, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

According to the situation, the expression "configured to (or set to)" used herein may be used as, for example, the expression "suitable for," "having the capacity to," "designed to," "adapted to," "made to," or "capable of". The term "configured to (or set to)" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in the present invention are used to describe specified embodiments of the present invention and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the present invention. In some cases, even if terms are terms which are defined in the specification, they may not be interpreted to exclude embodiments of the present invention.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and PlayStation™), electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to various embodiments may be one or more combinations of the above-mentioned devices. According to a certain embodiment, an electronic device may be a flexible electronic device. Also, electronic devices according to various embodiments of the present disclosure are not limited to the above-mentioned devices, and may include new electronic devices according to technology development.

Hereinafter, an electronic device according to the present invention will be described with reference to the accompanying drawings. The term "user" as used in embodiments of the present invention may indicate a person who uses an electronic device or a device (e.g., artificial intelligence electronic device) that uses an electronic device.

Referring to FIG. 1, there is illustrated an electronic device 101 in a network environment 100 according to various example embodiments. The electronic device 101 may include a bus 110, a processor 120, a memory 130, an input/output interface 150, a display 160, and a communication interface 170. According to an example embodiment, the electronic device 101 may not include at least one of the above-described elements or may further include other element(s).

The bus 110 may interconnect the above-described elements 120-170 and may include a circuit for transmitting communications (for example, a control message or data) among the above-described elements.

The processor 120 may include various processing circuitry, such as, for example, and without limitation, one or more of a dedicated processor, a central processing unit (CPU), an application processor (AP), or a communication processor (CP), or the like. The processor 120 may perform, for example, an operation or data processing associated with control and/or communication of at least one other element(s) of the electronic device 101.

The memory 130 may include a volatile memory and/or nonvolatile memory. The memory 130 may store commands or data associated with at least one other element(s) of the electronic device 101. According to an example embodiment, the memory 130 may store software and/or a program 140. The program 140 may include, for example, a kernel 141, a middleware 143, an application programming interface (API) 145, and/or an application program (or an application) 147. At least a portion of the kernel 141, the middleware 143, or the API 145 may be called an "operating system (OS)."

The kernel 141 may control or manage system resources (for example, the bus 110, the processor 120, the memory 130, and the like) that are used to execute operations or functions of other programs (for example, the middleware 143, the API 145, or the application program 147). Furthermore, the kernel 141 may provide an interface that allows the middleware 143, the API 145, or the application program 147 to access discrete elements of the electronic device 101 so as to control or manage system resources.

The middleware 143 may perform a mediation role such that the API 145 or the application program 147 communicates with the kernel 141 to exchange data.

Furthermore, the middleware 143 may process one or more task requests received from the application program 147 according to a priority. For example, the middleware 143 may assign the priority, which makes it possible to use a system resource (for example, the bus 110, the processor 120, the memory 130, or the like) of the electronic device 101, to at least one of the application program 147, and may process the one or more task requests.

The API 145 may be an interface through which the application 147 controls a function provided by the kernel 141 or the middleware 143, and may include, for example, at least one interface or function (for example, an instruction) for a file control, a window control, image processing, a character control, or the like.

The input/output interface 150 may include various input/output circuitry and transmit a command or data, input from a user or another external device, to other element(s) of the electronic device 101. Furthermore, the input/output interface 150 may output a command or data, received from other element(s) of the electronic device 101, to a user or another external device.

The display 160 may include, for example, a liquid crystal display (LCD), a light-emitting diode (LED) display, an organic LED (OLED) display, a microelectromechanical systems (MEMS) display, or an electronic paper display, or the like, but is not limited thereto. The display 160 may display, for example, various contents (for example, a text, an image, a video, an icon, and/or a symbol) to a user. The display 160 may include a touch screen and may receive, for example, a touch, gesture, proximity, or hovering input using an electronic pen or a portion of a user's body.

The communication interface 170 may include various communication circuitry and establish communication between the electronic device 101 and an external device (for example, a first external electronic device 102, a second external electronic device 104, or a server 106). For example, the communication interface 170 may be connected to a network 162 through wireless communication or wired communication to communicate with the external device (for example, the second external electronic device 104 or the server 106).

The wireless communication may include cellular communication using at least one of, for example, long-term evolution (LTE), LTE Advanced (LTE-A), code division multiple access (CDMA), wideband CDMA (WCDMA), universal mobile telecommunications system (UMTS), wireless broadband (WiBro), global system for mobile communications (GSM), or the like. According to an example embodiment, as indicated by reference numeral 164 in FIG. 1, the wireless communication may include at least one of wireless fidelity (WiFi), light fidelity (LiFi), Bluetooth, Bluetooth low energy (BLE), Zigbee, near field communication (NFC), magnetic secure transmission, radio frequency (RF), or a body area network (BAN). According to an example embodiment, the wireless communication may include global navigation satellite system (GNSS). The GNSS may include, for example, global positioning system (GPS), global navigation satellite system (Glonass), BeiDou navigation satellite system (hereinafter, referred to as "BeiDou") or Galileo, the European global satellite-based navigation system. Hereinafter, "GPS" and "GNSS" may be interchangeably used in the present disclosure. The wired communication may include at least one of, for example, a universal serial bus (USB), a high-definition multimedia interface (HDMI), a recommended standard-232 (RS-232), power line communication, or a plain old telephone service (POTS). The network 162 may include at least one of telecommunications networks, for example, a computer network (for example, local area network (LAN) or wide area network (WAN)), an internet, or a telephone network.

Each of the first and second external electronic devices 102, 104 may be the same or different type of device as or from the electronic device 101. According to various embodiments, all or a portion of operations that the electronic device 101 will perform may be executed by another or plural other electronic devices (for example, the electronic devices 102, 104 or the server 106). According to an example embodiment, when the electronic device 101 should execute any function or service automatically or in response to a request, the electronic device 101 may not perform the function or the service internally, but, alternatively or additionally, it may request at least a portion of a function associated with the electronic device 101 at other device (for example, the electronic device 102, 104 or the server 106). The other electronic device (for example, the electronic device 102, 104 or the server 106) may execute the requested function or additional function and may transmit the execution result to the electronic device 101. The electronic device 101 may provide the requested function or service using the received result or may additionally process the received result to provide the requested function or service. To achieve this, for example, cloud computing, distributed computing, or client-server computing may be used.

Figure 2:
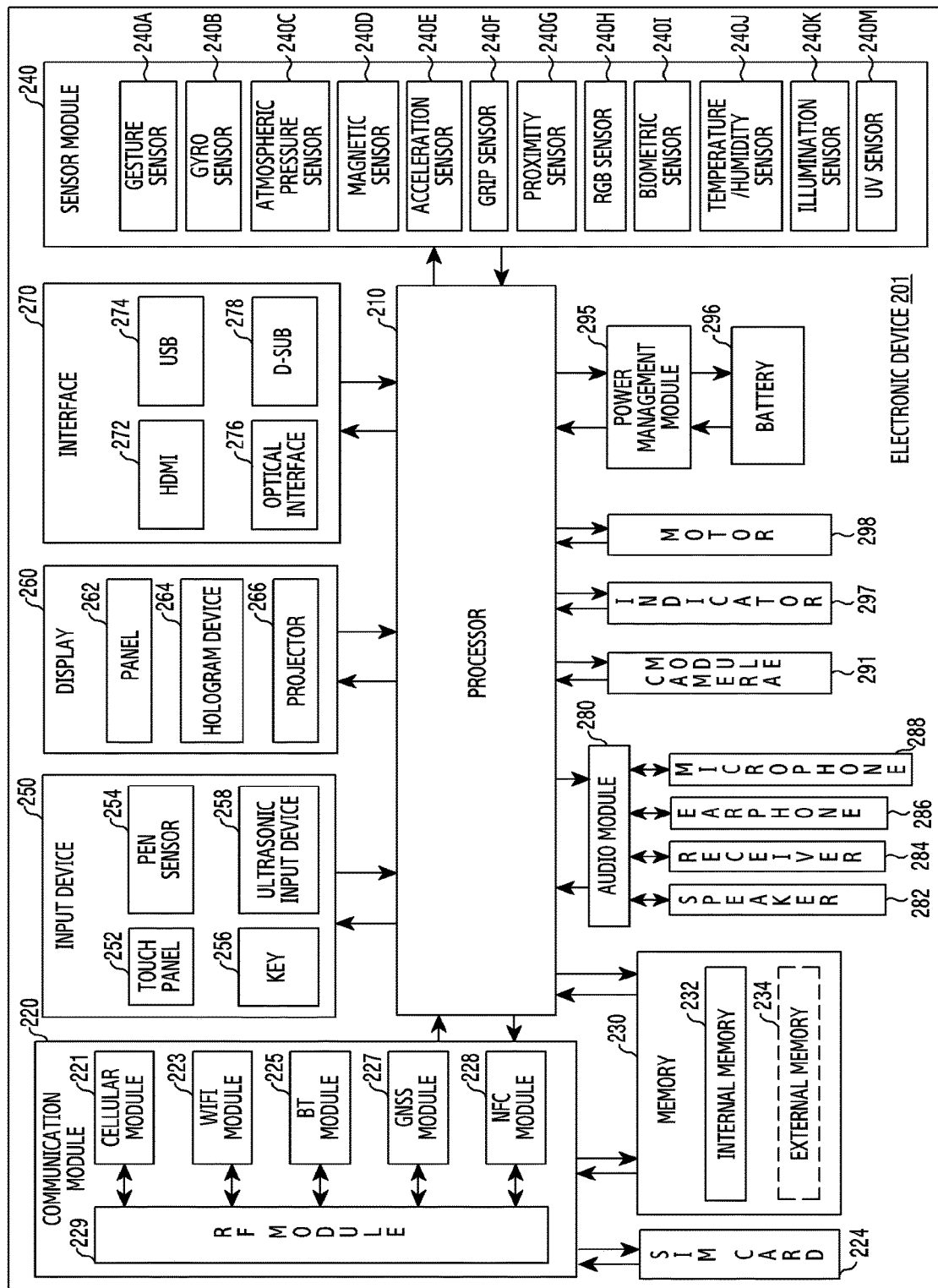
FIG. 2 is a block diagram of an electronic device according to various embodiments of the present disclosure.

FIG. 2 is a block diagram of an electronic device 201 according to various embodiments. The electronic device 201 may constitute, for example, the entirety or a part of the electronic device 101 illustrated in FIG. 1, or may expand all or some elements of the electronic device 101. The electronic device 201 may include one or more processors (e.g., an application processor (AP)) 210, a communication module 220, a subscriber identification module 224, a memory 230, a sensor module 240, an input device 250, a display 260, an interface 270, an audio module 280, a camera module 291, a power management module 295, a battery 296, an indicator 297, and a motor 298.

The processor 210 may, for example, operate an operating system or an application program, to control a majority of hardware or software constituent elements connected to the processor 210, and may perform various data processing and operations. The processor 210 may be, for example, implemented as a system on chip (SoC). According to an exemplary embodiment, the processor 210 may further include a graphic processing unit (GPU) and/or an image signal processor (ISP). The processor 210 may include at least some (e.g., cellular module 221) of the constituent elements shown in FIG. 2 as well. The processor 210 may load a command or data received from at least one of the other constituent elements (e.g., non-volatile memory) to a volatile memory and process the loaded command or data, and may store the result data in the non-volatile memory.

The communication module 220 may have a configuration, which is the same as or similar to that of the communication interface 160 of FIG. 1. The communication module 220 may, for example, include a cellular module 221, a WiFi module 223, a Bluetooth module 225, a GNSS module 227, an NFC module 228, and an RF module 229.

The cellular module 221 provides a voice telephony, a video telephony, a text service, an Internet service, and the like, through a telecommunication network (e.g., LTE, LTE-A, CDMA, WCDMA, UMTS, WiBro, GSM, and the like). In addition, the cellular module 221 may, for example, use a SIM card 224 to perform electronic device distinction and authorization within the telecommunication network. According to an embodiment of the present invention, the cellular module 221 may perform at least some of functions that the AP 210 may provide. For example, the cellular module 221 performs at least one part of a multimedia control function.

The WiFi module 223, the BT module 225, the GPS module 227 and the NFC module 228 each may include, for example, a processor for processing data transmitted/received through the corresponding module. According to an embodiment of the present invention, at least some (e.g., two or more) of the cellular module 221, the WiFi module 223, the BT module 225, the GPS module 227 and the NFC module 228 are included within one IC or IC package.

The RF module 229 performs transmission/reception of data, for example, transmission/reception of an RF signal. The RF module 229 may include, for example, a transceiver, a power amplifier module (PAM), a frequency filter, a low noise amplifier (LNA), an antenna and the like. According to an embodiment of the present invention, at least one of the cellular module 221, the WiFi module 223, the BT module 225, the GPS module 227 or the NFC module 228 may perform transmission/reception of an RF signal through a separate RF module.

The SIM card 224 includes a SIM, and may be inserted into a slot provided in a specific position of the electronic device 201. The SIM card 224 includes unique identification information (e.g., an integrated circuit card ID (ICCID)) or subscriber information (e.g., an international mobile subscriber identity (IMSI)).

The memory 230 includes an internal memory 232 or an external memory 234. The internal memory 232 includes, for example, at least one of a volatile memory (e.g., a dynamic random access memory (DRAM), a static RAM (SRAM) and a synchronous DRAM (SDRAM)) or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory).

The external memory 234 may further include a flash drive, for example, compact flash (CF), secure digital (SD), micro-SD, mini-SD, extreme digital (xD), a memory stick, and the like. The external memory 234 may be operatively connected with the electronic device 201 through various interfaces.

The sensor module 240 measures a physical quantity or detects an activation state of the electronic device 101, and converts measured or detected information into an electric signal. The sensor module 240 includes, for example, at least one of a gesture sensor 240A, a gyro sensor 240B, an air pressure sensor 240C, a magnetic sensor 240D, an acceleration sensor 240E, a grip sensor 240F, a proximity sensor 240G, a color sensor 240H (e.g., a red, green, blue (RGB) sensor), a bio-physical sensor 240I, a temperature/humidity sensor 240J, an illumination sensor 240K, a ultraviolet (UV) sensor 240M, and the like. Additionally or alternatively, the sensor module 240 may also include, for example, an E-nose sensor, an electromyography (EMG) sensor, an electroencephalogram (EEG) sensor, an electrocardiogram (ECG) sensor, an infrared (IR) sensor, an iris sensor, a fingerprint sensor, and the like. The sensor module 240 may further include a control circuit for controlling at least one or more sensors belonging therein.

The input device 250 includes a touch panel 252, a (digital) pen sensor 254, a key 256, an ultrasonic input device 258, and the like. The touch panel 252 may, for example, detect a touch input in at least one of a capacitive overlay scheme, a pressure sensitive scheme, an infrared beam scheme, and an acoustic wave scheme. The touch panel 252 may also include a control circuit. In a case of the capacitive overlay scheme, physical contact or proximity detection is possible. The touch panel 252 may further include a tactile layer, to provide a tactile response to a user.

The (digital) pen sensor 254 may be implemented in the same or similar method to receiving a user's touch input or by using a separate sheet for detection. The key 256 may include, for example, a physical button, an optical key, or a keypad. The ultrasonic input device 258 is capable of identifying data by detecting a sound wave in the electronic device 201 through an input tool generating an ultrasonic signal, and enables wireless detection. According to an embodiment of the present invention, the electronic device 201 may also use the communication module 220 to receive a user input from a connected external device (e.g., a computer or a server).

The display 260 (e.g., the display 160) includes a panel 262, a hologram device 264, or a projector 266. The panel 262 may be, for example, an LCD, an Active-Matrix Organic LED (AMOLED), and the like. The panel 262 may be, for example, implemented to be flexible, transparent, or wearable. The panel 262 may be constructed as one module along with the touch panel 252 as well. The hologram device 264 may use interference of light to show a three-dimensional image in the air. The projector 266 may project light to a screen to display an image. The screen may be, for example, located inside or outside the electronic device 201. According to an embodiment of the present invention, the display 260 may further include a control circuit for controlling the panel 262, the hologram device 264, or the projector 266.

The interface 270 includes, for example, a high-definition multimedia interface (HDMI) 272, a universal service bus (USB) 274, an optical interface 276, or a D-subminiature (D-sub) 278. Additionally or alternatively, the interface 270 includes, for example, a mobile high-definition link (MHL) interface, an SD card/multimedia card (MMC) interface or an infrared data association (IrDA) standard interface.

The audio module 280 converts a voice and an electric signal interactively. The audio module 280 may, for example, process sound information which is inputted or outputted through a speaker 282, a receiver 284, an earphone 286, the microphone 288, and the like.

The camera module 291 takes still pictures and moving pictures. According to an embodiment of the present invention, the camera module 291 includes one or more image sensors (e.g., a front sensor or a rear sensor), a lens, an image signal processor (ISP), or a flash (e.g., an LED or a xenon lamp).

The power management module 295 manages electric power of the electronic device 201. The power management module 295 includes, for example, a power management integrated circuit (PMIC), a charger IC, a battery, a battery gauge, and the like. The PMIC may be, for example, mounted within an integrated circuit or an SoC semiconductor. A charging scheme may be divided into a wired charging scheme and a wireless charging scheme. The charger IC charges the battery 296, and prevents the inflow of overvoltage or overcurrent from an electric charger. According to an embodiment of the present invention, the charger IC includes a charger IC for at least one of the wired charging scheme or the wireless charging scheme. The wireless charging scheme may, for example, be a magnetic resonance scheme, a magnetic induction scheme, an electromagnetic wave scheme, and the like. A supplementary circuit for wireless charging, for example, a circuit, such as a coil loop, a resonance circuit, a rectifier, and the like, may be added. The battery gauge may, for example, measure a level of the battery 296, a voltage during charging, a current or a temperature. The battery 296 generates or stores electricity, and uses the stored or generated electricity to supply power to the electronic device 201. The battery 296 may include, for example, a rechargeable battery or a solar battery.

The indicator 297 displays a specific status of the electronic device 201 or one part (e.g., the AP 210) thereof, for example a booting state, a message state, a charging state, and the like. The motor 298 may convert an electric signal into a mechanical vibration. The electronic device 101 may include a processing device (e.g., a GPU) for mobile TV support. The processing device for mobile TV support may, for example, process media data according to the standards of digital multimedia broadcasting (DMB), digital video broadcasting (DVB), a media flow, and the like.

Each of the above-described elements of the electronic device may include one or more components, and the name of a corresponding element may vary according to the type of electronic device. The electronic device according to the present invention may include at least one of the above-described elements and may exclude some of the elements or further include other additional elements. Further, some of the elements of the electronic device according to the present invention may be coupled to form a single entity while performing the same functions as those of the corresponding elements before the coupling.

According to one embodiment, the processor 210 may generate an image through an application operation. When the application operation is associated with a sensor (e.g., an image sensor), the processor 210 may remove an image corresponding to the first region in which the sensor is located, in the generated image. Thereafter, the processor 210 may display on the display the entire image from which the image of the first region has been removed.

According to another embodiment, when the application operation is not associated with a sensor, the processor 210 may correct the image of the first region in which the sensor is located, in the generated image.

For example, the processor 210 may compensate for the image of the first region with a higher brightness or saturation compared to the original image (e.g., the image of the second region) such that the image of the first region is not visually awkward. For example, the second region may be a peripheral region of the first region in an opaque display region.

As another example, the processor 210 may compensate for the hue of the image of the first region by adjusting the optical characteristics of at least one organic light-emitting element in the second region. As still another example, the processor 210 may compensate for the hue of the image of the first region by adjusting the optical characteristics of at least one organic light-emitting element of the first region. As yet another example, the processor 210 may compensate for the hue of the image of the first region by adjusting the optical characteristics of at least one organic light-emitting element of the first region and the optical characteristics of at least one organic light-emitting element of the second region.

Thereafter, the processor 210 may display on the display the entire image on which the image of the first region has been corrected.

Figure 3A:
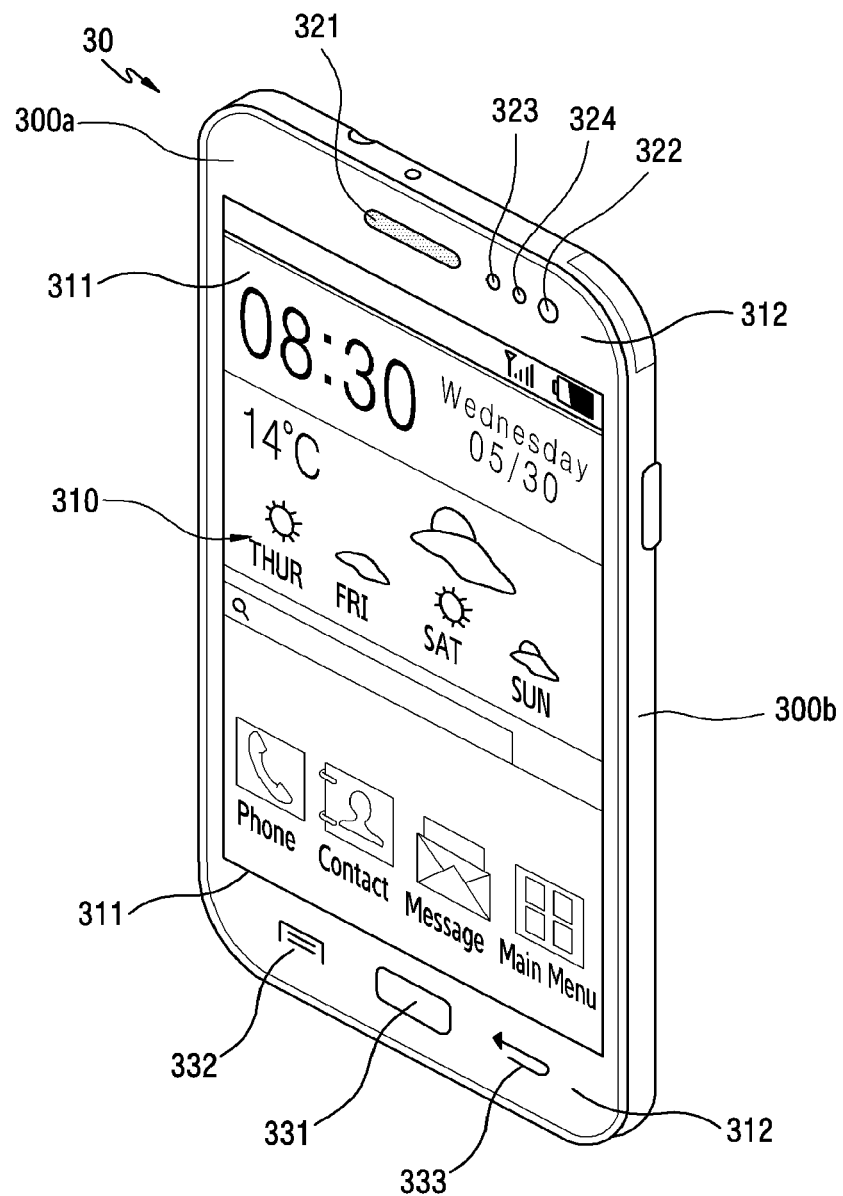
FIG. 3A is a perspective view illustrating the front face of an electronic device according to various embodiments.
Figure 3B:
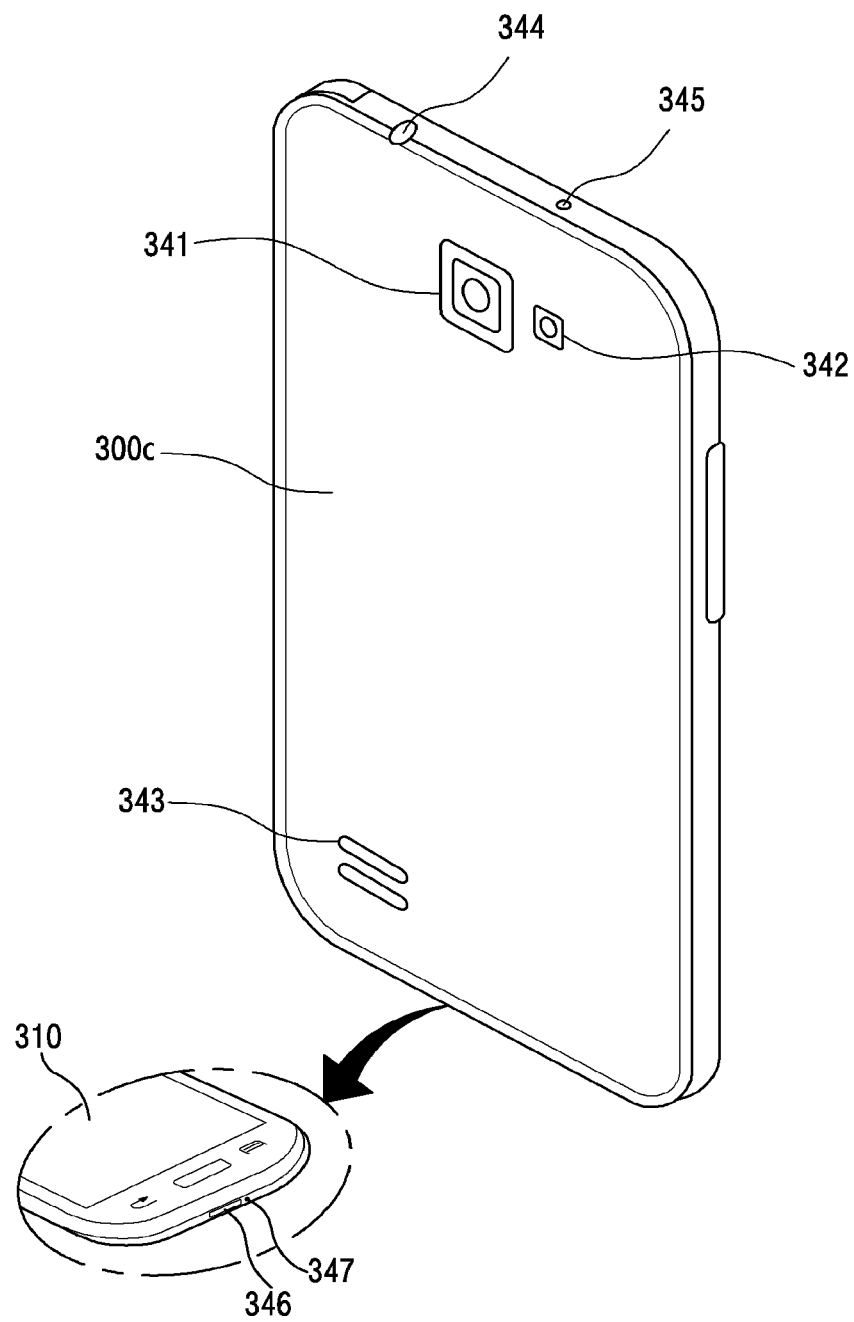
FIG. 3B is a perspective view illustrating the rear face of the electronic device according to various embodiments.

FIG. 3A is a perspective view illustrating the front face of an electronic device according to various embodiments. FIG. 3B is a perspective view illustrating the rear face of the electronic device according to various embodiments. The electronic device 30 according to various embodiments may be an electronic device, which is the same as the electronic devices 101 and 201 illustrated in FIGS. 1 and 2.

FIG. 3A is a perspective view illustrating the front face of an electronic device according to various embodiments. FIG. 3B is a perspective view illustrating the rear face of the electronic device according to various embodiments.

Referring to FIGS. 3A and 3B, the electronic device 30 according to various embodiments may include a display 310 that is disposed on the front face 300*a* thereof. The front face 300*a* of an electronic device according to various embodiments may include a display area 311 in which the display 310 is disposed so as to display various data, and a non-display area 312. For example, the non-display area 312 may be referred to as a bezel area or a Black Matrix (BM) area.

The display 310 according to various embodiments may be as a large screen so as to occupy most of the front face 300*a* of the electronic device 30. For example, the display 310 may be configured as a touch screen by being provided with a touch sensitive panel. FIG. 3A illustrates an example in which a main home screen is displayed on the display 310. The main home screen may be a first screen that is displayed on the display 310 when the power supply of the electronic device 30 is turned on. For example, when the electronic device 30 has several pages of different home screens, the main home screen may be the first home screen among the several pages of different home screens. The home screen may display shortcut icons to execute frequently used applications, a main menu switching key, time, weather, or the like. The main menu switching key may cause a menu screen to be displayed on the display 310.

According to various embodiments, in the upper end of the display 310, status bars may be formed to indicate the statuses of the electronic device 30, such as a battery charging status, the intensity of a received signal, and the current time. According to various embodiments, below the display 310, a home key 331, a menu key 332, and a back key 333 may be formed.

The home key 331 may cause the main home screen to be displayed on the display 310. For example, when the home key 331 is touched in the state in which a home screen, which is different from the main home screen, or a menu screen is displayed on the display 310, the main home screen may be displayed on the display 310. In addition, when the home key 310 is touched while applications are executed on the display 310, the main home screen may be displayed on the display 310. In addition, the home key 331 may also be used in order to cause the most recently used application or a task manager to be displayed on the display 310.

According to various embodiments, the menu key 332 may provide a connection menu capable of being used on the display 310. The connection menu may include a widget addition menu, a background screen change menu, a retrieve menu, an edition menu, an environment setting menu, and the like. The back button 333 may cause the screen, which was executed just prior to the currently executed screen, to be displayed, or may cause the most recently used application to be terminated.

According to various embodiments, a front camera 322, an illuminance sensor 323, and a proximity sensor 324 may be arranged in an edge of the front face 300a of the electronic device 30. A rear camera 341, a flash 342, and a speaker 343 may be arranged on the rear face 300c of the electronic device 30. For example, a power/reset button, a volume button, a terrestrial DMB antenna for broadcasting reception, one or more microphones 345 and 347, and the like may be arranged on the side faces 300b of the electronic device 30. According to various embodiments, a connector 346 may be formed on the lower end side face of the electronic device 30. The connector 346 is formed with a plurality of electrodes, and may be connected to an external device via a wire. An earphone connecting jack 344 may be arranged on the upper end side face of the electronic device 30. An earphone may be inserted into the earphone connecting jack 344.

Figure 4:
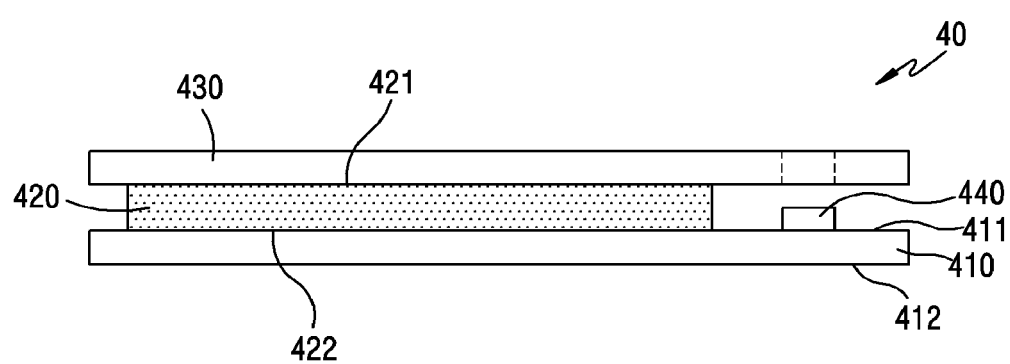
FIG. 4 is a cross-sectional view illustrating the configuration of a main portion of an electronic device according to various embodiments.

FIG. 4 is a cross-sectional view illustrating the configuration of a main portion of an electronic device according to various embodiments.

Referring to FIG. 4, the electronic device 40 according to various embodiments may be an electronic device, which is the same as the electronic device 30 illustrated in FIGS. 3A and 3B.

According to various embodiments, the electronic device 40 may include a board 410, a display 420, a window 430, and a component 440. The board 410 according to various embodiments may be a printed circuit board of a hard material or a flexible printed circuit board of a flexible material. The board 410 may be a double-sided printed circuit board on which components are mounted on each of the opposite faces.

The board 410 according to various embodiments may include a first face 411 and a second face 412 opposite the first face 411. The first face 411 may be the top face on the top side of the board, and the second face 412 may be the bottom face on the bottom side of the board. A display may be disposed on the first face 411 of the board.

The display 420 according to various embodiments may include a first face 421 and a second face 422 opposite the first face 421. A window 430 may be disposed on first face 421 of the display. The display may include, for example, a Liquid Crystal Display (LCD), a Light-Emitting Diode (LED) display, an Organic Light-Emitting Diode (OLED) display, or a MicroElectroMechanical System (MEMS) display, or an electronic paper display.

The display 420 according to various embodiments may display various contents (e.g., a text, an image, a video, an icon, or a symbol) to the user. The display 420 may be provided with a touch sensitive panel so as to receive a touch input, a gesture input, a proximity input, or a hovering input that is made using, for example, an electronic pen or a part of the user's body.

The window 430 according to various embodiments may be disposed in the outermost layer of the front face of the electronic device 40. For example, the window 430 may be made of glass or a synthetic resin. The window 430 may be made of a transparent material. The window 430 may be opaque with a printing layer provided on the bottom surface thereof that does not face the display 420.

At least one component 440 may be disposed on the first face 411 of the board 410 according to various embodiments in an SMD manner. The components 440 may be disposed on the board 410 in parallel with the display 420, rather than being stacked with the display 420. The component 440 may be disposed between the board 410 and the window 430. For example, the component 440 may be a proximity sensor, an illuminance sensor, a front camera, or a receiver.

However, the electronic device 40 according to various embodiments has a structural problem that the non-display area cannot be utilized as a display area. For example, there is a structural limitation that an area where the component is disposed cannot be utilized as a display area.

Figure 5:
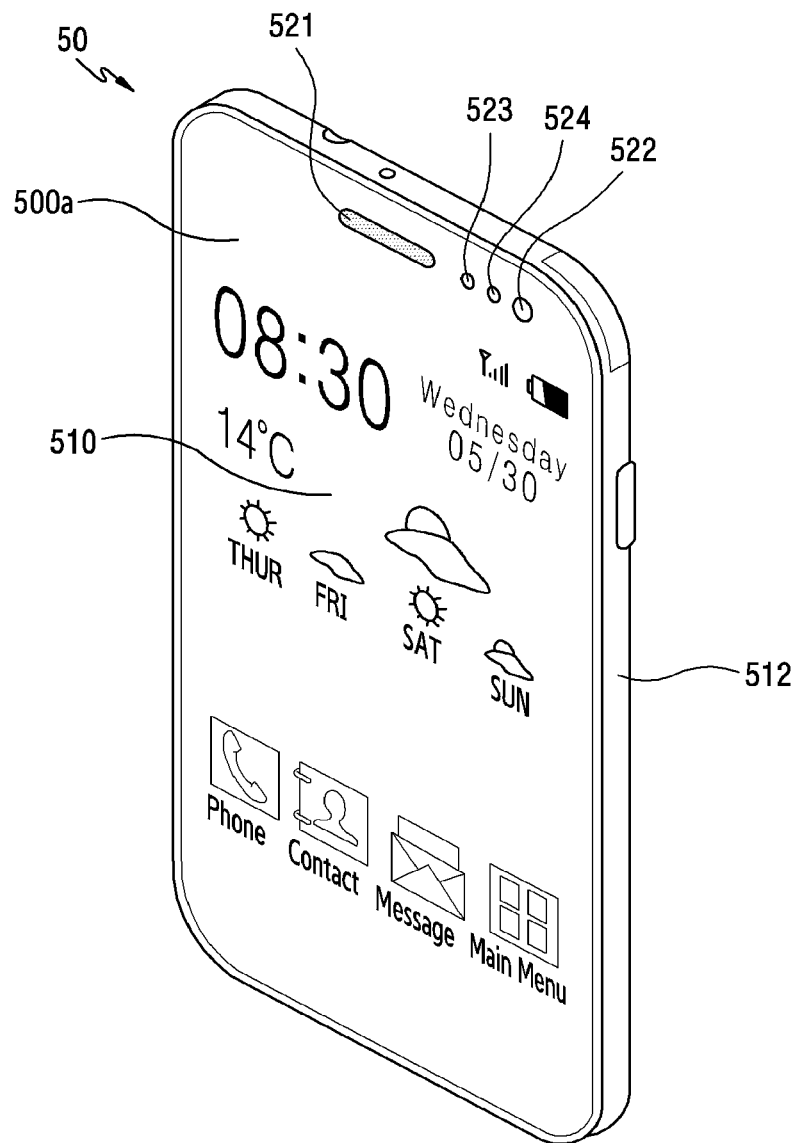
FIG. 5 is a perspective view illustrating the front face of an electronic device according to various embodiments of the present disclosure.

FIG. 5 is a perspective view illustrating the front face of an electronic device according to various embodiments of the present disclosure.

Referring to FIG. 5, an electronic device according to various embodiments may be an electronic device which is the same as the electronic devices 101 and 201 illustrated in FIGS. 1 and 2.

It is possible to make the external appearance of an electronic device 50 according to various embodiments, in particular, the external appearance of the front face 500a beautiful and to secure a wider display appearance by disposing components such as a sensor in the lower portion inside the display 510. A transparent board according to various embodiments (a transparent window 730 in FIG. 7) is to form substantially the entire first face of the housing, and the display 510 is exposed through substantially the entire first face of the transparent substrate.

The components concealed in the lower portion inside the display 510 of the electronic device 50 according to various embodiments may be optical components associated with light. For example, the components may be components that require external exposure of light, or that emit light. For example, such optical components may include a fingerprint scanner, an image capture device, a strobe, an optical sensor, a proximity sensor, an indicator, a solar panel, etc. For example, a first camera 522, an illuminance sensor 523, and a proximity sensor 524 may be arranged in an edge of the front face 500a of the electronic 50.

The display 510 may be disposed on the front face 500a of the electronic device according to various embodiments. The display 510 may be disposed over the entire front face. For example, the display 510 may include an organic light-emitting diode (OLED). The electronic device 50 according to various embodiments may be referred to as a "full front display" because the display 510 is disposed on the entire front face 500a. In the "full front display", the entire front face 500a of the electronic device may be the display area. As an exception, the area where the receiver 521 is mounted may not be included in the display area.

The display according to various embodiments, for example, an Organic Light-Emitting Display (OLED) may be a self-emission type display device which includes an organic light-emitting element including a hole injection electrode, an electron injection electrode, and an organic light-emitting layer disposed therebetween, and which generates light when an exciton, which is generated as a hole injected from the hole injection electrode and an electron injected from the electron injection electrode are coupled to each other in the organic light-emitting layer, falls from an excited state to a ground state. Since an OLED does not require a separate light source, the OLED can be driven at a low voltage and can be configured a lightweight and thin type. Further, the OLED is excellent in characteristics such as a viewing angle, contrast, and response speed.

The display 510 according to various embodiments may include a plurality of display areas having different pixel densities. The display 510 may include a first display area (an area in which components 521 to 524 are not disposed) having a first pixel density and a second display area (an area in which components 521-524 are disposed) having a second pixel density. In addition, the display 510 may further include a third display area having a third pixel density, and the like. The first pixel density may be different from the second pixel density, and the first pixel density may be larger than the second pixel density.

The electronic device 500 according to various embodiments may include side faces 512. The side rims 512 may be disposed so as to be in direct contact with the first display area of the display 510. In the display 510 according to various embodiments, the first display area may be disposed to be in direct contact with each of the rims 512. For example, the rims 512 may include a synthetic resin or metal frame. For example, when the rims 512 include a metal frame, at least a portion of the rims 512 may serve as antenna radiators. When at least some of the rims 512 serve as an antenna radiator, the rims 512 may include one or more segmented portions or insulating portions. The segmented portions and the insulating portions may be formed on the upper and lower rims or on both side rims, respectively.

Figure 6A:
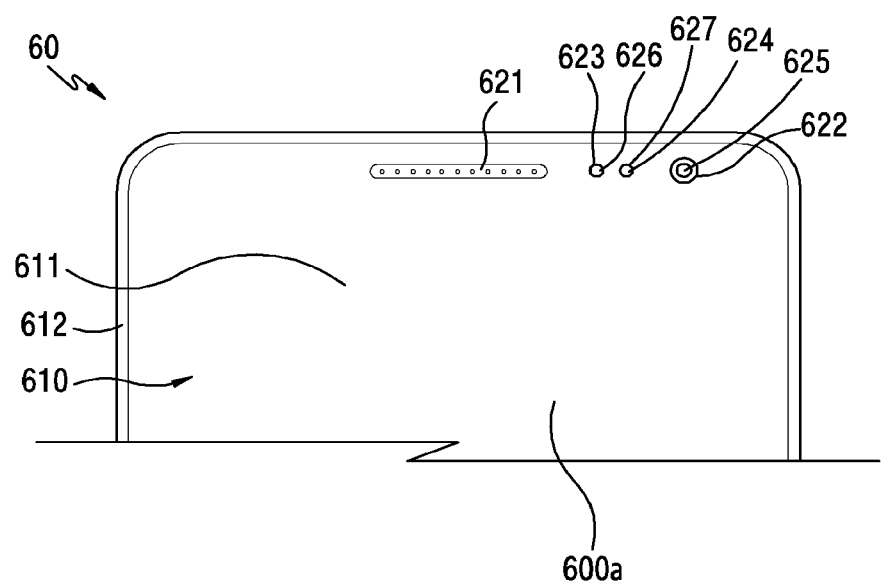
FIG. 6A is a front view illustrating the upper portion of the front face of an electronic device according to various embodiments of the present disclosure.

FIG. 6A is a front view illustrating the upper portion of the front face of an electronic device according to various embodiments of the present disclosure.

Referring to FIG. 6A, an electronic device 60 according to various embodiments may be an electronic device, which is the same as the electronic devices 101 and 201 illustrated in FIGS. 1 and 2. In addition, the electronic device 60 according to various embodiments may be the same as the electronic device 50 illustrated in FIG. 5.

According to various embodiments, the electronic device 60 may include a single display 610 disposed on the entire front face thereof. For example, the display 610 may include an organic light-emitting diode (OLED). The electronic device 60 according to various embodiments may be disposed such that at least a portion of the display 610 is in direct contact with the rim portions 612 of the electronic device. In the electronic device 60 according to various embodiments, the display 610 is in direct contact with all the rim portions 612 of the electronic device. The display 610 of the electronic device 60 according to various embodiments may have a slight separation distance from the rim portions 612. For example, the separation distance may be formed such that the distance between at least a portion of the display 610 and the rim portion 612 is 0.1 to 1 mm and the distance between at least another portion of the display and the rim portion is 1 mm to 5 mm. In this case, in the space corresponding to the separation distance, an opaque ink layer may be coated. The display 610 according to various embodiments may include a first display area 611 having a first pixel density and occupying most of the area thereof and one or more second display areas 622, 623, and 624 having a second pixel density. As an exception, the area where the receiver 621 is mounted may not be included in the display area. The first pixel density may be different from the second pixel density, and the first pixel density may be larger than the second pixel density. The second display areas according to various embodiments may include first to third areas 622, 623, and 624. Sensors 626 and 627 may be disposed in the second area 623 and the third area 624, respectively, and a front camera 625 may be disposed in the first area 622.

One or more sensors 625, 626, and 627 may be disposed on the front face of the electronic device 60 according to various embodiments. For example, the sensors are sensors associated with external light for the electronic device 60, and may be a proximity sensor, an illuminance sensor, a biosensor, an image sensor, a solar panel, an indicator, etc.

Figure 6B:
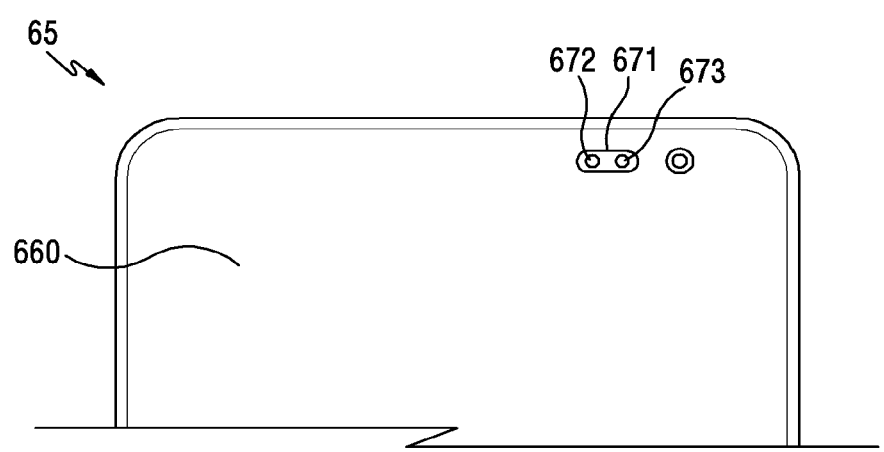
FIG. 6B is a front view illustrating the upper portion of the front face of an electronic device according to various embodiments of the present disclosure.

FIG. 6B is a front view illustrating the upper portion of the front face of an electronic device according to various embodiments of the present disclosure.

Referring to FIG. 6B, in an electronic device 65 according to various embodiments, two or more components 672 and 673 may be disposed in one second display area 671. FIG. 6A exemplifies that only one component is disposed in one second display area, but as in FIG. 6B, two or more components 672 and 673 may be disposed in one second display area 671 to be spaced apart from each other. Respective components 672 and 673 may be disposed side by side in the second display area 671.

Figure 7:
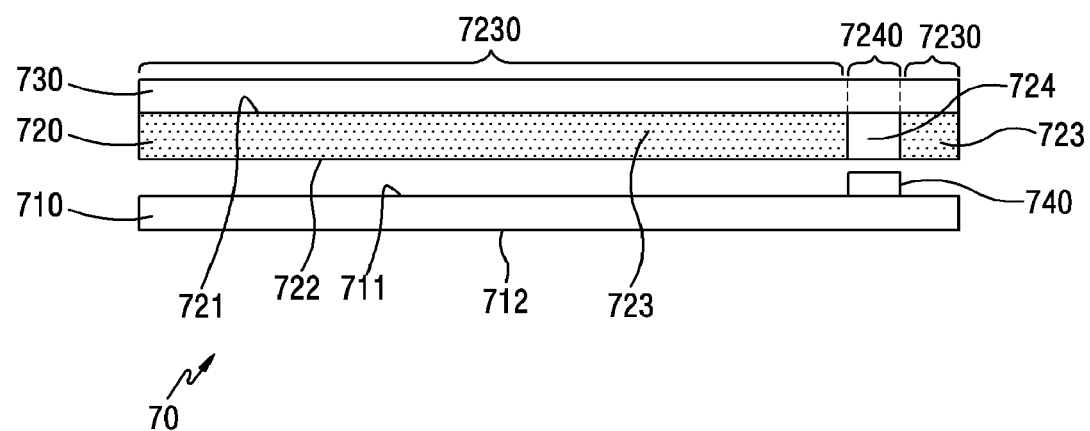
FIG. 7 is a cross-sectional view illustrating the configuration of a main portion of an electronic device according to various embodiments of the present disclosure.

FIG. 7 is a cross-sectional view illustrating the configuration of a main portion of an electronic device according to various embodiments of the present disclosure.

Referring to FIG. 7, an electronic device 70 according to various embodiments may be an electronic device, which is the same as each of the electronic devices 50 and 60, which are illustrated in FIGS. 5 and 6, respectively.

According to various embodiments, the electronic device 70 may include a board 710, a display 720, a window 730, and at least one component 740.

The board 710 according to various embodiments may include a first face 711 and a second face 712 opposite the first face 711. The first face 711 may be the top face on the top side of the board 710, and the second face 712 may be the bottom face on the bottom side of the board 710. The display 720 may be disposed on first face 711 of the board.

The display 720 according to various embodiments may include a first face 721 and a second face 722 opposite the first face 721. The display 720 may include a first display area 723 having a first pixel density and occupying most of the area thereof and at least one second display area 724 having a second pixel density. As an exception, the area where a receiver is mounted may not be included in the display area. The first pixel density may be different from the second pixel density, and the first pixel density may be larger than the second pixel density.

The electronic device 70 according to various embodiments may include first and second display area structures 7230 and 7240 according to the division of the first and second display areas 723 and 724. The first display area structure 7230 according to various embodiments may include a board 710, a first display area 723 on the board, and a window 730 on the first display area 723. The second display area structure 7240 according to various embodiments may include a board 710, at least one component 740 on the board 710, a second display area 724 disposed on the component 740, and a window 730 on the second display area 724.

The window 730 according to various embodiments may be disposed in the outermost layer of the front face of the electronic device 70. For example, the window 730 may be made of glass, or may be formed of a polymer film, and may include at least one of polyimide, polyethylene terephthalate (PET), and other polymer materials. The window 730 may be made of a transparent material.

At least one component 740 may be disposed on the first face 711 of the board according to various embodiments in an SMD manner. The component 740 may be disposed between the board 710 and display 720. For example, the component 740 may be any optical component associated with light, such as a gesture sensor, a motion sensor, a proximity sensor, an illuminance sensor, a biosensor, an image sensor, a fingerprint sensor, or a front camera.

The component 740 according to various embodiments may be disposed below the display 720 and face the second face 722 of the display. The component 740 according to various embodiments may be disposed below the second display area 724 so as to face the second display area 724. The window 730 according to various embodiments may have a structure in which the second display area 724 and the component 740 are vertically stacked.

According to various embodiments of the present disclosure, the display 720 may include a first display area 723 including a first pixel having a first structure 7230 and a second display area 724 including a second pixel having a second structure 7240, in which the second structure 7240 may be different from the first structure 7230. Here, the second display area 724 corresponds to an area where the component 740 (hereinafter, referred to as a "sensor") is located on the display, and the first display area 723 corresponds to an area where the sensor 740 is not located. The sensor 740 may be disposed to overlap at least a portion of the first area 723 and at least a portion of the second area 724 when viewed from above the display 720. The first display area 723 according to various embodiments may be driven independently of the second display area 724. For example, the first display area 723 and the second display area 724 may be driven such that the first display area 723 is activated and the second display area 724 is deactivated, both the first and second display areas 723 and 724 are activated, or the first display area 723 is deactivated and the second display area 724 is activated.

The transmissivity of the second display area 724 where the sensor 740 is located may be higher than the transmissivity of the first display area 723, and the number of pixels per unit area of the second display area 724 (pixels per inch (ppi)) may be lower than the number of pixels per unit area of the first display area 723. Also, according to various embodiments, the form of the first gate wiring lines and/or the form of the first data wiring lines across the first display area 723 of the display may be different from the form of the second gate wiring lines and/or the form of the second data wiring lines across the second display area 724 of the display.

According to various embodiments, the spacing between the data wiring lines and the spacing between the gate wiring lines in the second display area 724 where the sensor 740 is located on the display may be wider than the spacing between the data wiring lines and the spacing between the gate wiring lines in the first display area 723 where the sensor 740 is not located. Since the gate wiring lines and the data wiring lines may block and/or refract light, it is possible to reduce the light to be blocked or refracted by increasing the spacing of the gate wiring lines and the spacing of the data wiring lines in the second display area 724 so as to reduce the number of the gate wiring lines and data wiring lines. By widening the spacing between the data wiring lines and the gate wiring lines, the size of each of the sub-pixels R (red), G (green), and B (blue) in the second display area 724 becomes larger than that in the first display area 723, and the number of pixels per unit area in the second display area 724 may be smaller than that in the first display area 723.

The display 720 according to various embodiments may include a first area 723 in which a first group of one or more pixels is formed, and a second area 724 in which a second group of one or more pixels is formed, the second group being controllable independently from the first pixel group and the second area 724 being disposed above at least a portion of the sensor 740.

The electronic device 70 having a processor according to various embodiments may be set such that when the sensor 740 is activated, at least one pixel of the second pixel group is deactivated or activated to a first degree and when the sensor 740 is deactivated, the at least one pixel of the second group is activated to a second degree, and the second degree may be configured to be higher than the first degree.

The electronic device 70 having a processor according to various embodiments may be set such that when the sensor 740 is activated, at least one pixel of the first pixel group and at least one pixel of the second pixel group are differently activated, and when the sensor 740 is deactivated, the at least one pixel of the first pixel group and the at least one pixel of the second pixel group are equally activated.

In the electronic device 70 having a processor according to various embodiments, when the sensor 740 is activated, one of at least one pixel of the first pixel group and at least one pixel of the second pixel group may be completely deactivated. In addition, the electronic device 70 according to various embodiments may also be set such that when the sensor is deactivated, both of the at least one pixel of the first pixel group and the at least one pixel of the second pixel group are deactivated.

According to various embodiments, at least one pixel of the first pixel group may be formed in a first pixel structure, and at least one pixel of the second pixel group may be formed in a second pixel structure. The first pixel structure according to various embodiments may be configured to pass light obtained from the outside of the electronic device 70 to a first degree, and the second pixel structure may be configured to pass light obtained from the outside of the electronic device 70 to a second degree, and the second degree may be configured to be higher than the first degree. For example, the number of pixels per unit area (pixels per inch (ppi)) of the second area may be less than the number of pixels per unit area of the first area.

On the bottom side of the display 720 according to various embodiments, a protective layer (not illustrated) may be disposed in order to protect the display from impact by external pressure. The protective layer may include an embossed shock-absorbing pattern layer and/or a black layer. For example, the protective layer may include an elastic material on the outside thereof, and, for example, the shock-absorbing pattern layer may be formed to have a rough surface. The black layer may be formed of at least one of black ink, sponge, and rubber. For example, the black layer may block the light emitted downwards from the display 720 or may reflect the light upwards.

The protective layer according to various embodiments may include at least a partially removed area, and at least a portion of the part 740 may be disposed in the removed area. For example, the component 740 may be a sensor capable of receiving external light, and when the sensor is disposed below the shock-absorbing pattern layer and the black layer, the light path to the sensor cannot but be blocked. Accordingly, the protective layer having at least a partially removed area may be a layer (e.g., a shock-absorbing pattern layer 515 and/or a black layer 516) that fails to transmit light at a predetermined ratio or more.

The display 720 according to various embodiments may include a scan wiring line configured to transmit a first signal to a first pixel and/or a second pixel and a data wiring line configured to transmit a second signal to the first pixel and/the second pixel. In a display 720 according to various embodiments, the form of the first scan wiring lines and/or the form of the first data wiring lines disposed in the first area 723 may be configured to be different from the form of the second scan wiring lines and/or the form of the second data wiring lines disposed in the second area 724.

Figure 8:
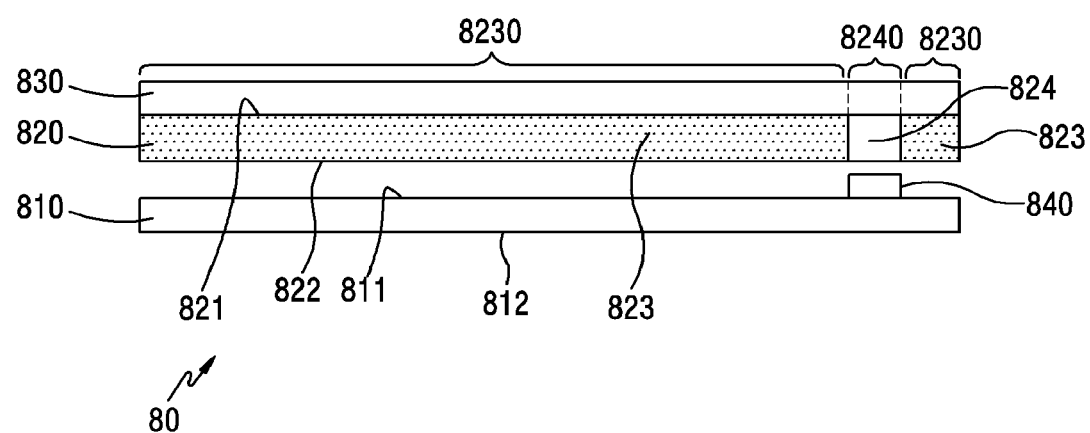
FIG. 8 is a cross-sectional view illustrating the configuration of a main portion of an electronic device according to various embodiments of the present disclosure.

FIG. 8 is a cross-sectional view illustrating the configuration of a main portion of an electronic device according to various embodiments of the present disclosure.

Referring to FIG. 8, an electronic device 80 according to various embodiments may be an electronic device, which is the same as the electronic devices 50 and 60, which are illustrated in FIGS. 5 and 6, respectively.

Since the electronic device 80 according to various embodiments is the same as the electronic device 70 illustrated in FIG. 7, except for the configuration for the second display area 824, a redundant description will be omitted.

The electronic device 80 according to various embodiments may include a second display area 824, which is not provided with pixels. For example, the second display area 824 may be a transparent window. The component 840 according to various embodiments may be disposed below the second display area structure 8240 so as to face the second display area structure 8240. According to one embodiment, a transparent layer may be formed by removing at least some organic light-emitting diodes from some pixel areas of a portion between respective pixel boundaries. For example, the transparent window may be a form in which opaque electrodes (for example, gate wiring lines, data wiring lines) among the first electrode and the second electrode with an organic luminescent material interposed therebetween are removed, or a form in which all of the first electrode, the second electrode, and the organic light-emitting material between the first electrode and the second electrode are removed. For example, the transparent window may thinner than the portion where the organic light emitting diode is disposed by the thickness of at least one of the first electrode, the second electrode, and the organic light-emitting material. The display may further include a planarization layer for flattening the heights of the portion where the organic light-emitting diode is disposed and the portion where at least a portion of the organic light-emitting diode is removed.

The electronic device 80 according to various embodiments may include first and second display area structures 8230 and 8240 according to the division of the first and second display areas 823 and 824. The first display area structure 8230 according to various embodiments may include a board 810, a first display area 823 on the board, and a window 830 on the first display area 823. The second display area structure 8240 according to various embodiments may include a board 810, at least one component 840 on the board 810, a second display area 824 disposed on the component 840, and a window 830 on the second display area 824. The window 830 according to various embodiments may have a structure in which the second display area 824 and the component 840 are vertically stacked.

For example, the component 840 may be any optical component associated with light, such as a gesture sensor, a motion sensor, a proximity sensor, an illuminance sensor, a biosensor, an image sensor, or a front camera.

Each of the electronic devices 70 and 80 according to various embodiments is not necessarily limited to a component disposed below the display, for example, the above listed sensors as examples of sensors, and a sensor capable of recognizing a gesture or a motion may be disposed so as to be utilized variously in a game mode.

In addition, the component 840 according to various embodiments may be a fingerprint recognition sensor. For example, when the component 840 is a fingerprint recognition sensor, the component 840 may acquire biometric information (e.g., fingerprint information) of the user through the window 830 and the second display area 824.

Figure 9A:
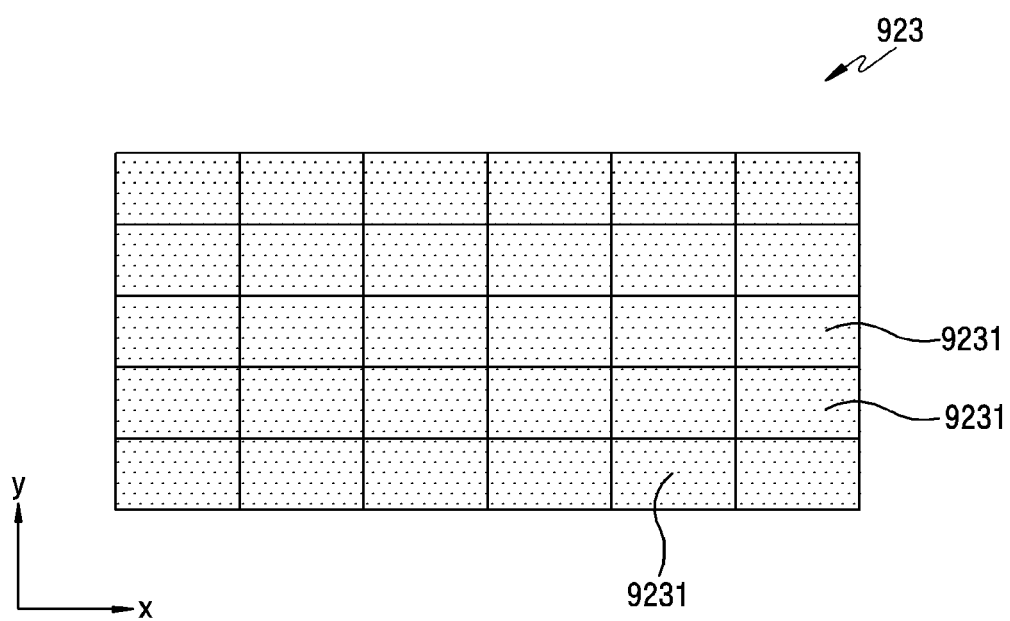
FIG. 9A is an exemplary view schematically illustrating the configuration of a first display area according to various embodiments of the present disclosure.
Figure 9B:
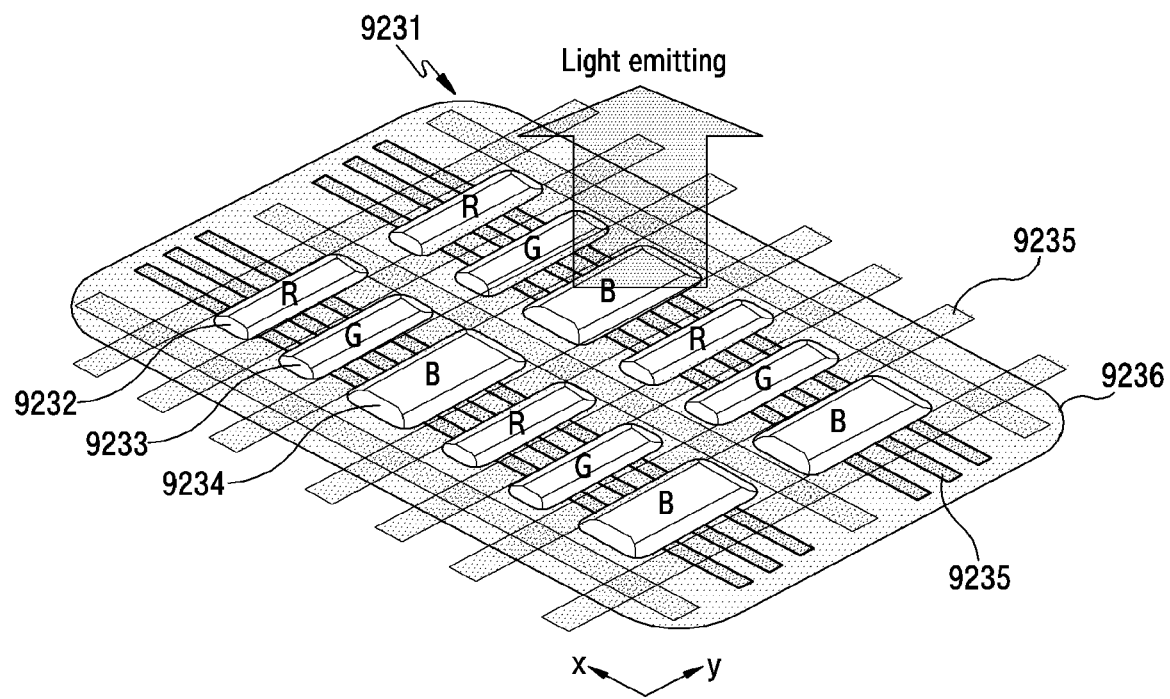
FIG. 9B is an exemplary view schematically illustrating the configuration of the first display area according to various embodiments of the present disclosure.

FIG. 9A is an exemplary view schematically illustrating the configuration of a first display area according to various embodiments of the present disclosure. FIG. 9B is an exemplary view schematically illustrating the configuration of the first display area according to various embodiments of the present disclosure.

Referring to FIGS. 9A and 9B, the first display area 923 according to various embodiments may be each of the first display areas 611, 723, and 823, which are illustrated in FIGS. 5 to 8, respectively.

The first display area 923 according to various embodiments may be a display area having a first pixel density including a plurality of pixel arrays. One pixel 9231 according to various embodiments may include a first organic light-emitting element 9232 that emits light of a first color, a second organic light-emitting element 9233 that emits light of a second color different from the first color, and a third organic light-emitting element 9234 that emits light of a third color, which is different from the first color and the second color, in which the first, second, and third organic light-emitting elements are sequentially disposed in a first direction X. The first display area 923 according to various embodiments may be a display area, which cannot transmit light to a predetermined degree or more.

A plurality of pixels 9231 according to various embodiments may be arranged in a matrix form and may have predetermined pixel densities in the first direction X and the second direction Y depending on the resolution. The first direction X may be substantially perpendicular to the second direction Y.

The first to third organic light-emitting elements 9232 to 9234 included in each pixel 9231 according to various embodiments may emit light of different first to third colors, which may be, for example, red (R), green (G), and blue (B), respectively. However, the present disclosure is not limited thereto, and any combination is possible as long as the first color to the third color is capable of realizing white light by combination.

Each of the first to third organic light-emitting elements 9232 to 9234 according to various embodiments may include first to third circuit portions 9235, and each of the first to third circuit portions 9235 may be disposed in the area of first to the third pixel electrodes 9236.

The electrode 150 of each of the first through third organic light-emitting elements 9232 to 9234 according to various embodiments may be constituted with a transparent or translucent electrode, may include a material selected from a group consisting of silver (Ag), aluminum (Al), magnesium (Mg), lithium (Li), calcium (Ca), copper (Cu), LiF/Ca, LiF/Al, MgAg, and CaAg, and may be formed in a thin film having a thickness of several to several tens of nanometers.

Each of the first to third circuit portions 9235 may include first to third thin film transistors, which are electrically connected to the first to third pixel electrodes 9236, respectively, and may be disposed in an area overlap the first to third pixel electrodes in a plan view.

Figure 10A:
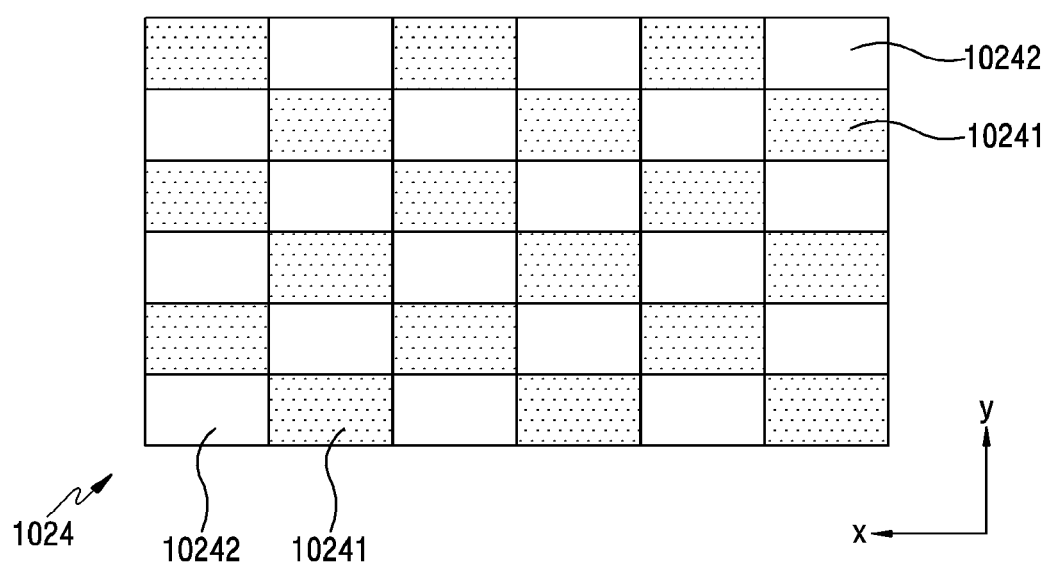
FIG. 10A is an exemplary view schematically illustrating the configuration of a second display area according to various embodiments of the present disclosure.
Figure 10B:
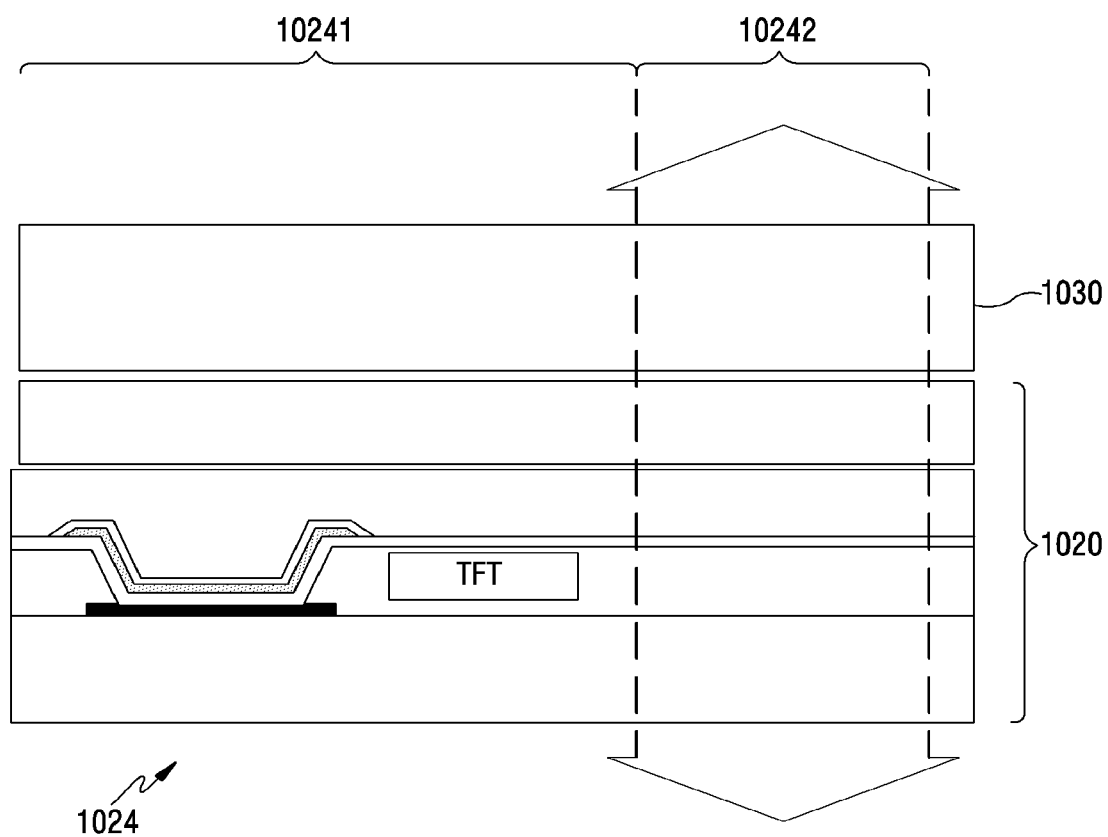
FIG. 10B is an exemplary view schematically illustrating the configuration of the second display area according to various embodiments of the present disclosure.

FIG. 10A is an exemplary view schematically illustrating the configuration of a second display area according to various embodiments of the present disclosure. FIG. 10B is an exemplary view schematically illustrating the configuration of the second display area according to various embodiments of the present disclosure.

Referring to FIGS. 10A and 10B, a display according to various embodiments may include a second display area 1024 having a pixel density different from the pixel density of the first display area 923 illustrated in FIGS. 9A and 9B. The second display area 1024 according to various embodiments may be the same as the second display area 724 illustrated in FIG. 7.

The second display area 1024 according to various embodiments may include first areas 10241 having a first pixel density and second areas 10242 having a second pixel density. The first and second areas 10241 and 10224 may be one display area. Reference numeral 1030 may denote a window.

Each of the first areas 10241 according to various embodiments may include a first organic light-emitting element that emits light of a first color, a second organic light-emitting element that emits light of a second color different from the first color, and a third organic light-emitting element that emits light of a third color, which is different from the first color and the second color, in which the first, second, and third organic light-emitting elements are sequentially disposed in the first direction X. The first areas 10241 according to various embodiments may be display areas, which may be non-transmissive areas. The second areas 10242 according to various embodiments may be display areas, which may be transmissive areas.

The arranged first areas 10241 according to various embodiments may be arranged in a matrix form together with the second areas 10242 and each of the first areas 10241 may have predetermined pixel densities in the first direction X and the second direction Y depending on the resolution. The first direction X may be substantially perpendicular to the second direction Y.

The second areas 10242 according to various embodiments are areas through which external light can be transmitted, and each second area may be disposed between adjacent first areas 10241, in which each second area 10242 may be disposed between adjacent first areas in the X direction and the second areas may be regularly disposed between the first areas 10241 in the Y direction. For example, the second areas 10242 may be referred to as transmissive windows because external light can be transmitted therethrough.

Figure 11:
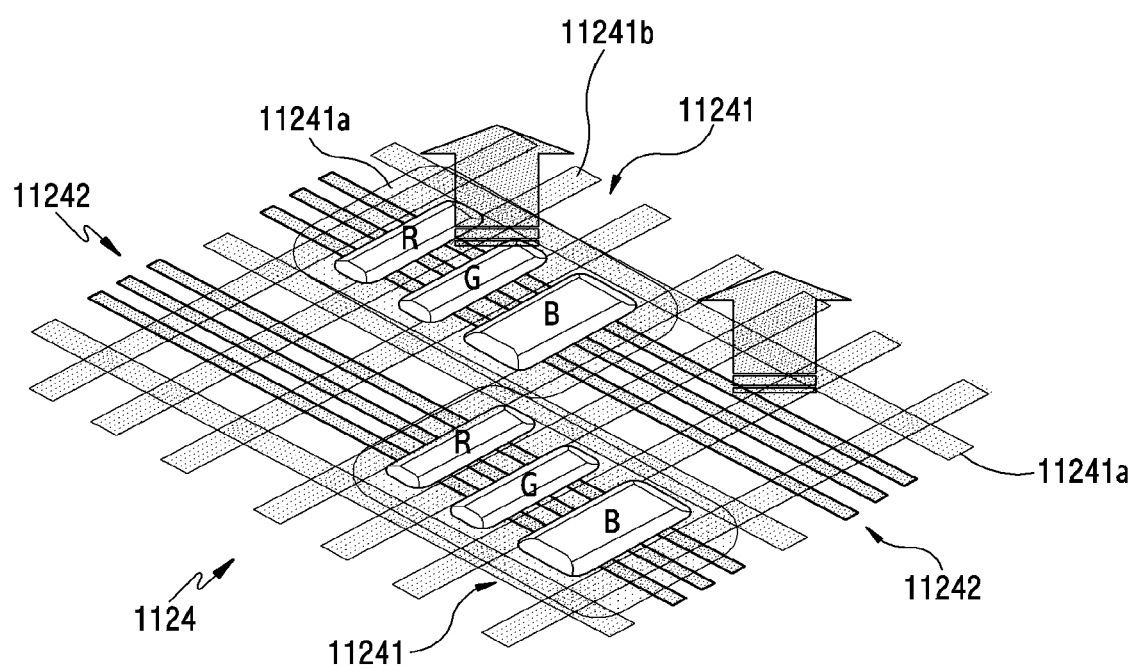
FIG. 11 is a perspective view schematically illustrating the configuration of the second display area according to various embodiments of the present disclosure.

FIG. 11 is a perspective view schematically illustrating the configuration of the second display area according to various embodiments of the present disclosure.

Referring to FIG. 11, the display area 1124 according to various embodiments may be the same as the second display area 1024 illustrated in FIGS. 10A and 10B. The second display area 1124 according to various embodiments may be the same as the second display area 724 illustrated in FIG. 7.

The second display area 1124 according to various embodiments may include first areas 11241 having a first pixel density and second areas 11242, through which external light can pass. Here, the TFT circuit and the wiring lines 11241b of the first area 11241 in which the organic light-emitting material is disposed may be formed on the electrodes 11241a. The wiring lines 11242a of the second area 11242 may be formed such that only the minimum wiring lines for connecting the upper and lower portions are present.

Figure 12:
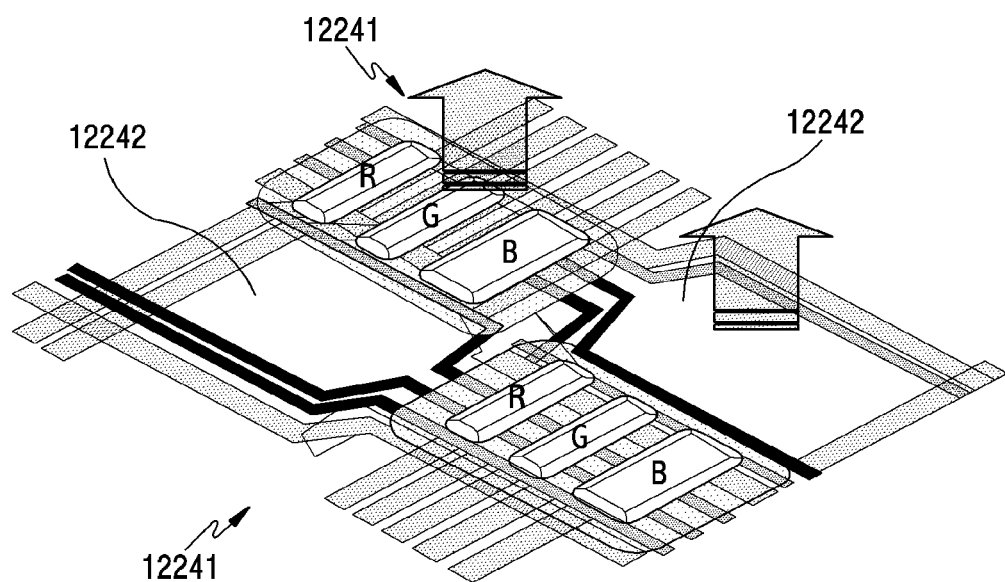
FIG. 12 is a perspective view schematically illustrating the configuration of the second display area according to various embodiments of the present disclosure.

FIG. 12 is a perspective view schematically illustrating the configuration of the second display area according to various embodiments of the present disclosure.

Referring to FIG. 12, the second display area 1224 according to various embodiments may be the same as the second display area 824 illustrated in FIG. 8.

In the display area 1224 according to various embodiments, when the wiring lines to be formed in the second areas 12242 are formed as opaque wiring lines, the opaque wiring lines may be collectively disposed in the first areas 12241. For example, the second areas 12242 may be transparent to external light and may be transparent windows. The second areas 12424 may have improved transparency and transmittance.

Figure 13:
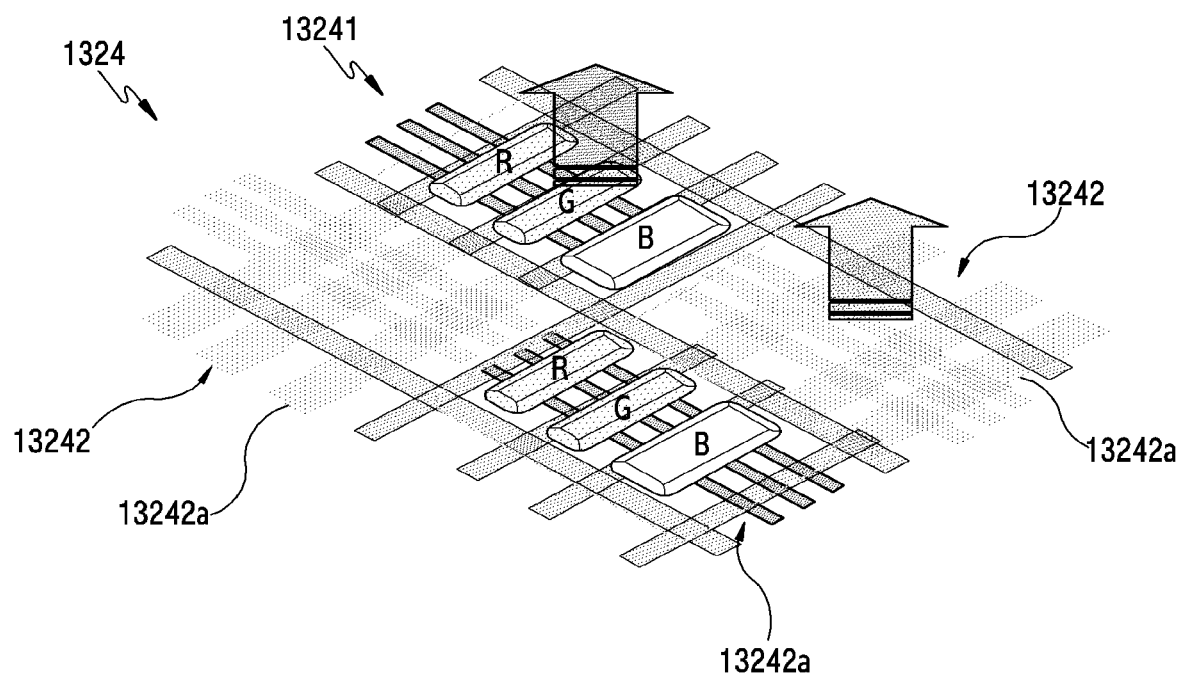
FIG. 13 is a perspective view schematically illustrating the configuration of the second display area according to various embodiments of the present disclosure.

FIG. 13 is a perspective view schematically illustrating the configuration of the second display area according to various embodiments of the present disclosure.

Referring to FIG. 13, the second display area 1324 according to various embodiments may be the same as the second display area 824 illustrated in FIG. 8.

In the second display area 1324 according to various embodiments, the wiring lines to be formed in the second areas 13242 may be formed as the transparent wiring lines 13242a. For example, the second areas 13242 may be transparent to external light and may be transparent windows. The second areas 13424 may have improved transparency and transmittance. In addition, the first display area 13241 may be formed of transparent wiring lines or opaque wiring lines. For example, for transparent wiring lines 13242a, ITO, Ag nanowires, and graphene may be used.

Figure 14:
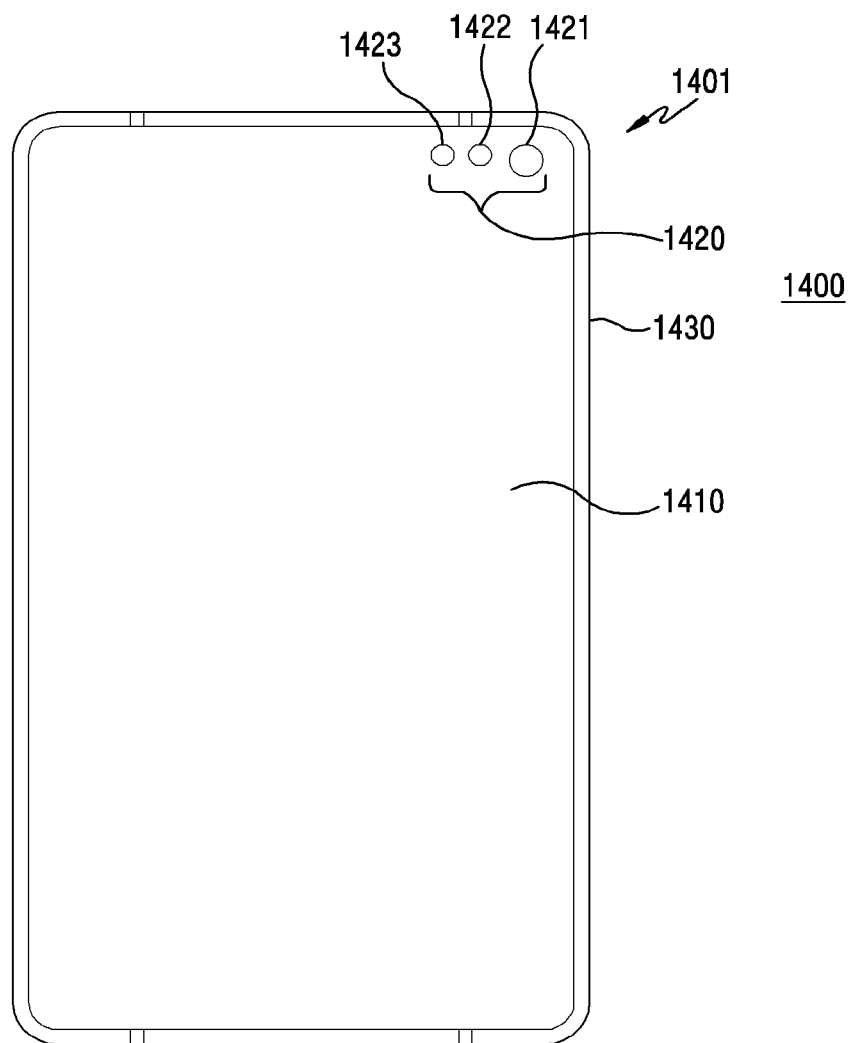
FIG. 14 is a front view illustrating an electronic device according to various embodiments of the present disclosure.

Referring to FIG. 14, an electronic device 1400 according to various embodiments may be an electronic device, which is the same as the electronic device illustrated in FIG. 8. The electronic device 1400 according to various embodiments may include a bar-type housing 1401 and may include a front area in which a display occupying substantially most of the front face is disposed. The front area according to various embodiments may include a first area 1410, which occupies most of the front area and in which a plurality of pixels may be disposed to be capable of displaying colors, and a second area 1420 in which light acquired from the outside is passed through a sensor (see FIG. 3). The first and second areas 1410 and 1420 may be disposed within a display (see FIG. 8). A plurality of pixels (a plurality of pixel groups) may be disposed in the first area 1410 so that the first area may be a structure that can display colors, while a plurality of pixels are not disposed in the second area 1420, and thus the second area may be a structure that cannot display colors. The pixel structure of the first area 1410 may be the same as the pixel structure illustrated in FIGS. 9A and 9B.

In the electronic device 1400 according to various embodiments, the display may occupy substantially the entire front area of the housing 1401, and the disposed display may be disposed to be exposed throughout the entire front area.

In the electronic device 1400 according to various embodiments, when viewed from above a transparent cover, for example, the window (see FIG. 8), a sensor may be disposed to overlap a portion of the first area 1410 and a portion of the second area 1420, or may be disposed overlap a portion within the second area 1420. For example, the sensor disposed under the second area 1420 may include any one or a combination of a camera (an image sensor), a gesture sensor, a motion sensor, a proximity sensor, an illuminance sensor, and a biosensor. In particular, the sensor may be associated with an optical sensor that can operate by an optical phenomenon.

According to various embodiments, one or more second areas 1420 may be disposed. For example, the second area 1420 may include a first portion 1421 in which a first sensor is disposed, a second portion 1422 in which a second sensor is disposed, and a third portion 1423 in which a third sensor is disposed. The first to third portions 1421 to 1423 may be configured to be different from each other or to be equal to each other in the degree of transmission of external light. In other words, the first to third portions 1421 to 1423 may be configured to have different degrees of light transmission depending on the types of sensors to be disposed therein. The first to third portions 1421 to 1423 may be disposed side by side so as to be spaced apart from each other. The first to third portions 1421 to 1423 may be disposed in parallel with the upper end of the housing 1401 or in parallel with an edge region of the housing 1401.

The second area 1420 according to various embodiments is not limited to a circular shape, and may be formed in various shapes (e.g., an elliptical shape, a polygonal shape, etc.).

The second area 1420 according to various embodiments may be disposed within a flat display area or within a flexible display area that provides a curved area.

The front area of the electronic device 1400 in which the first and second areas 1410 and 1420 according to various embodiments are combined may be at least partially enclosed by and at least partially in contact with a rim portion 1430. In particular, the first area 1410 may be at least partially enclosed by and at least partially in contact with the rim portion 1430. The rim portion 1430 according to various embodiments may include a plastic or metal material. For example, when the rim portion 1430 includes a metal material, at least a portion of the rim portion 1430 may operate as an antenna radiator.

The structure of the second area according to various embodiments will be described with reference to FIGS. 15 to 17.

Figure 15:
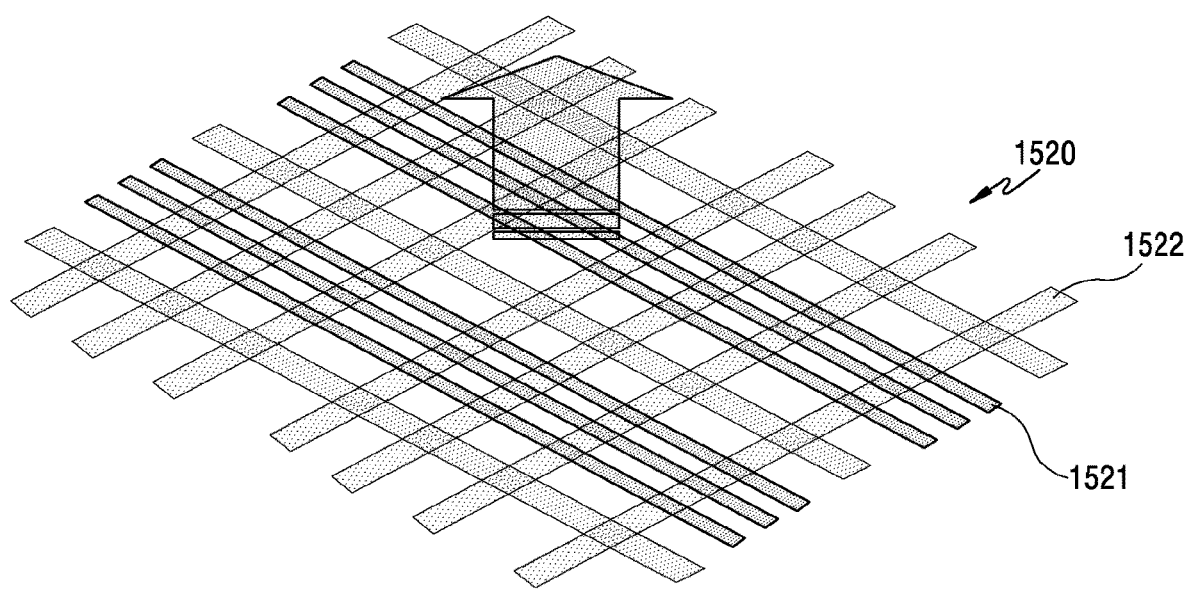
FIGS. 15, 16, and 17 are views each illustrating a structure of the wiring lines in the second area of the display according to various embodiments of the present disclosure.

Referring to FIG. 15, the second area 1520 according to various embodiments may be the same area as the second area 1420 illustrated in FIG. 14. The second area 1520 may be configured such that organic light-emitting elements and an opaque electrode layer are removed, and only minimal wiring lines exist. For example, the second area may become a transparent window capable of transmitting light since the second area is configured such that only the minimal opaque wiring lines and the TFT circuit wiring lines of the organic light-emitting elements disposed in the first area are allowed to pass through the second area.

Figure 16:
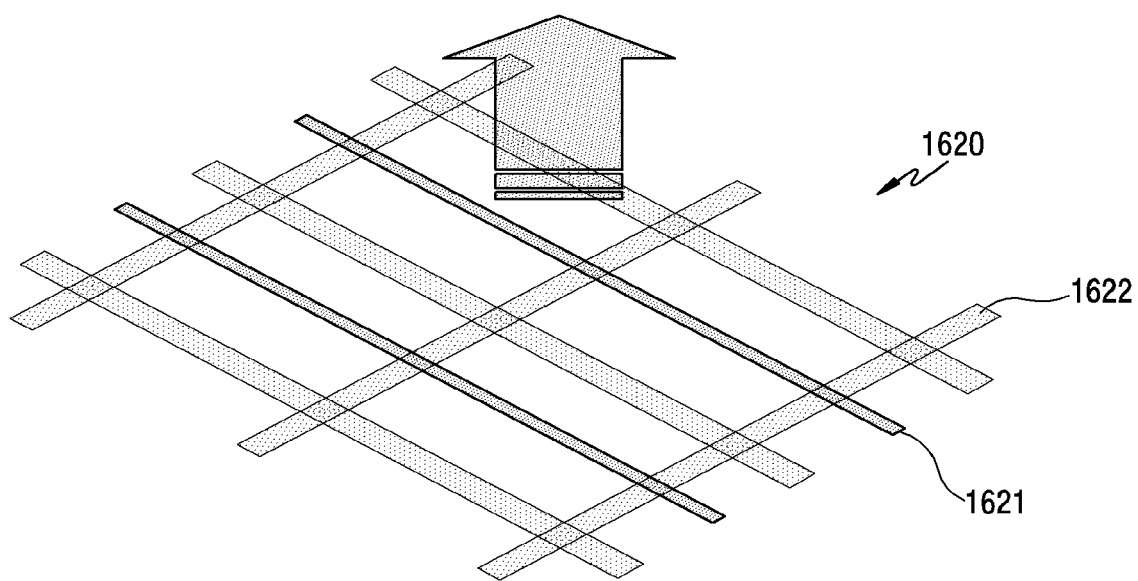

Referring to FIG. 16, the second area 1620 according to various embodiments may be the same area as the second area 1420 illustrated in FIG. 14. The second area 1620 may be configured such that organic light-emitting elements and an opaque electrode layer are removed, and only minimal wiring lines exist. For example, the second area 1620 may become a transparent window capable of transmitting light since the second area 1620 is configured such that only the minimal opaque wiring lines 1621 of the organic light-emitting elements disposed in the first area and the TFT circuit wiring lines 1622 of the organic light-emitting elements disposed in the first area are allowed to pass through the second area 1620.

The second area 1620 according to various embodiments are configured such that opaque wiring lines and TFT circuit wiring lines of the organic light-emitting elements are disposed in a vertically stacked manner, so that the second area 1620 can be improved in transparency and transmittance in comparison with the second area 1520 illustrated in FIG. 15. For example, when the opaque wiring lines and the TFT circuit wiring lines of the organic light-emitting elements are stacked in three layers, the wiring lines passing through the second area 1620 can be reduced to ⅓. This will be described later in detail with reference to FIG. 18A.

Figure 17:
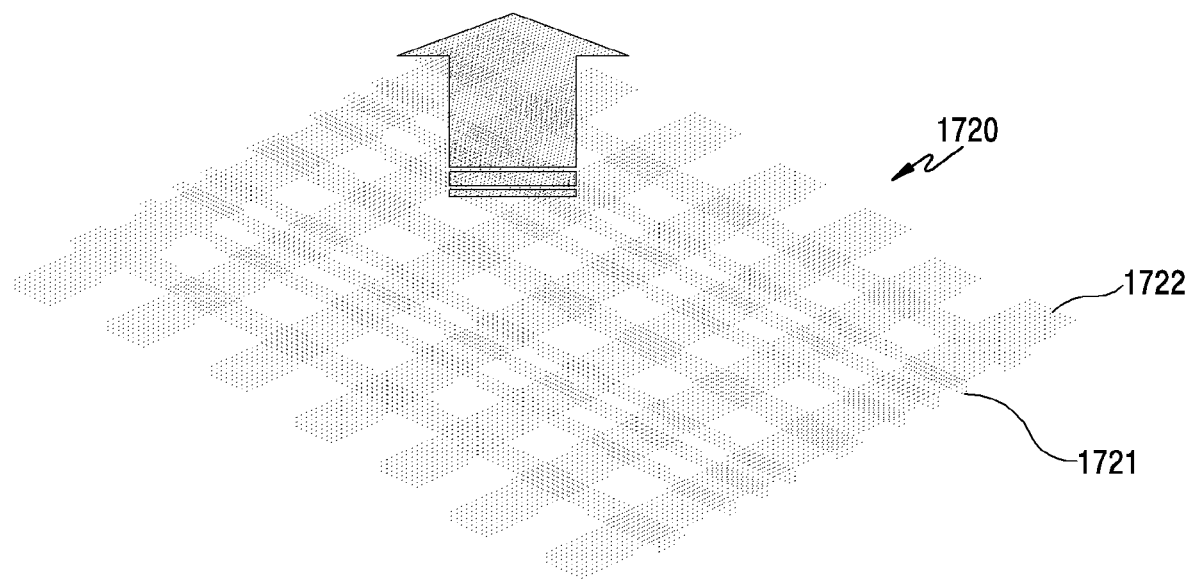

Referring to FIG. 17, the second area 1720 according to various embodiments may be the same area as the second area 1420 illustrated in FIG. 14. The second area 1720 may be configured such that organic light-emitting elements and an opaque electrode layer are removed, and only minimal wiring lines exist. For example, in the second area 1720, the minimal opaque wiring lines of the organic light-emitting elements disposed in the first area and the TFT circuit wiring lines of the organic light-emitting elements disposed in the first area may be configured to be transparent, so that the transparency and transmittance can be improved. For example, for transparent wiring lines, Ag nanowires and graphene may be used.

Figure 18A:
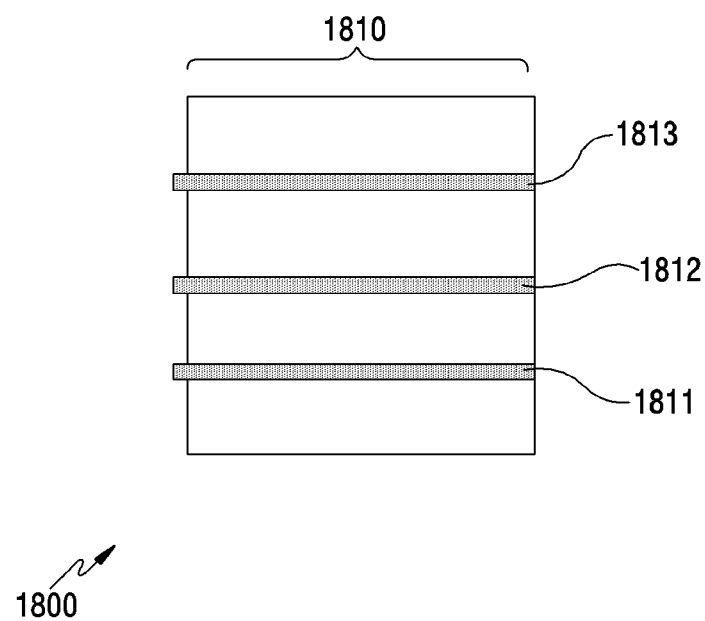
FIG. 18A is a cross-sectional view illustrating a structure of wiring lines of a display according to various embodiments of the present disclosure.

FIG. 18A is a cross-sectional view illustrating a structure of wiring lines of a display according to various embodiments of the present disclosure.

Referring to FIG. 18A, when a plurality of opaque wiring lines are used in the display area 1810 according to various embodiments, the opaque wiring lines 1811, 1812, and 1813 are stacked in the vertical direction, so that transparency and transmittance can be improved in the display area. For example, when viewing the display area from vertically above, in comparison with the structure in which opaque wiring lines are arranged in parallel with each other, opaque wiring lines are seen only about ⅓ when the opaque wiring lines are stacked in the vertical direction, so that the transparency of the display area can be improved.

Figure 18B:
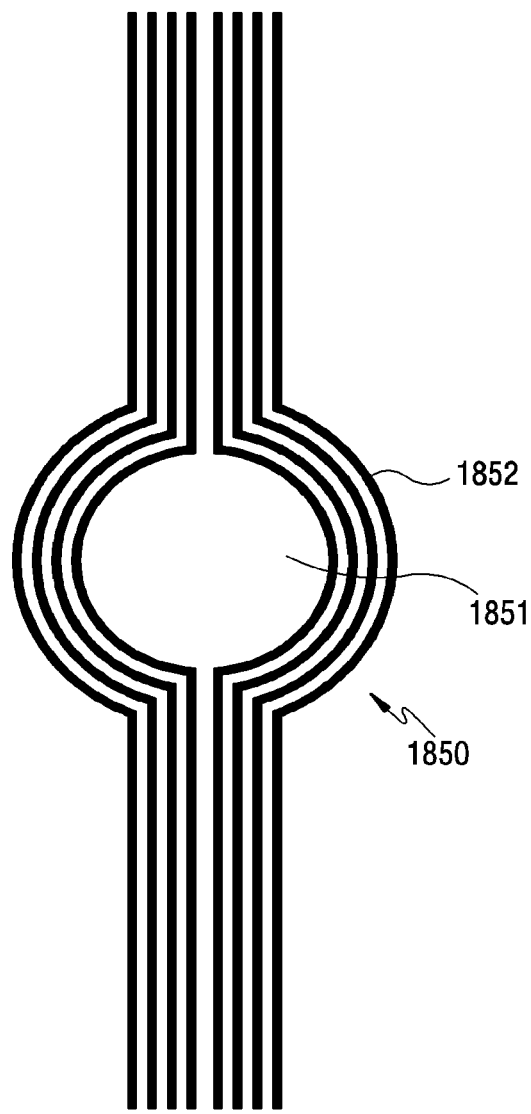
FIG. 18B is an exemplary view illustrating a shape of wiring lines of the second display according to various embodiments of the present disclosure.

FIG. 18B is an exemplary view illustrating a shape of wiring lines of a second display 1850 according to various embodiments of the present disclosure.

Referring to FIG. 18B, when the second display area 1851 according to various embodiments is to be configured as a transparent window, the opaque wiring lines 1852 are arranged to be detoured around the second display area 1851, so that the transparency and transmittance of the second display area 1851 can be improved. The opaque wiring lines include a plurality of gate wiring lines arranged in the horizontal direction and a plurality of data wiring lines arranged in the vertical direction, and the plurality of gate wiring lines and the plurality of data wiring lines may form pixels in the form of a matrix. A gate wiring line is capable of transmitting a signal for scanning each gate pixel to each pixel, and a data wiring line is capable of transmitting a signal associated with image information to be displayed to each pixel through each data pixel. In the first display area, all the gate wiring lines and the data wiring lines may be provided in straight lines, but some of the gate wiring lines and the data wiring lines in the second display area 1851 may be bent outwards from the center of the second display area 1851.

For example, when viewing the second display 1850 from vertically above, since the opaque wiring lines 1852 are excluded from the second display area 1851, so that the transparency of the second display area 1851 can be improved.

Figure 19:
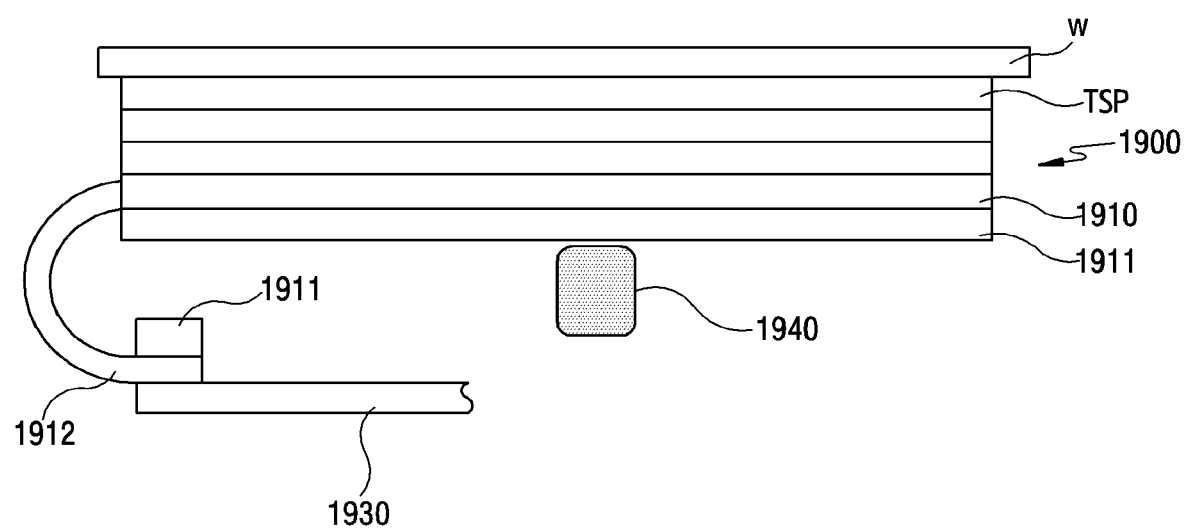
FIG. 19 is a cross-sectional side view illustrating the structure of a display of an electronic device according to various embodiments of the present disclosure.

Referring to FIG. 19, according to one embodiment, a display bottom plate 1900 may be at least partially bent. For example, the display bottom plate 1900 may be curved in an inactive area where organic light-emitting diodes are not disposed. For example, a Display Driver Integrated circuit (DDI) may be disposed in a portion of a bent portion 1912 of the display bottom plate 1900. For example, traces electrically connected between the display gate wiring lines or data wiring lines and the display driver integrated circuit may be disposed in different portions in the curved portion of the display bottom plate 1900. The display bottom plate 1900 may be formed of a flexible polymer film and may include polyimide, polyethylene terephthalate (PET), or other polymer materials. For example, the display bottom plate 1900 may be formed of double layers including a first polymer layer 1910 (e.g., polyimide) and a second polymer layer 1911 (e.g., polyethylene terephthalate), and at least a portion of the second polymer layer 1911 (e.g., polyethylene terephthalate) may be removed in the bent portion 1912. Reference symbol w may denote a transparent window, and reference symbol TSP may denote a touch sensitive panel. 1930 may denote a Flexible Printed Circuit Board (FPCB), and 1940 may denote a sensor.

According to various embodiments, the sensor 1940 may be a fingerprint recognition sensor. For example, the fingerprint recognition sensor is capable of acquiring biometric information (e.g., fingerprint information) of the user through a transparent substrate w.

The sensor 1940 according to various embodiments may acquire biometric information, which corresponds to a body part (e.g., a finger) of the user and is acquired through an opening or a transparent area formed in at least a portion of the display.

An electronic device according to various embodiments of the present disclosure may include at least one of a pressure sensor, a fingerprint sensor, and an antenna integrated with a display or a touch screen. For example, at least one of the pressure sensor, the fingerprint sensor, and the antenna may be disposed between the transparent substrate w and the display, and may include at least one electrode layer.

For example, the transparent substrate w may include a transparent window or a transparent cover. For example, at least one electrode layer may be formed directly on the face of the transparent substrate w in the second direction or on the face of the display in the first direction, or may be formed on a separate film and attached to the transparent substrate or the display. For example, at least one electrode layer may be disposed inside the display. In this case, at least one electrode layer may be disposed between the top and bottom plates of the display, and may be disposed between other electrodes configured to drive the display.

According to one embodiment, at least one of a pressure sensor control circuit, a fingerprint sensor control circuit, and a communication circuit may be integrated with a Display Drive Integrated circuit (DDI). The integrated circuit may be formed on a single flexible printed circuit board. For example, at least two of a first signal generated from the integrated circuit and transmitted to the display, a second signal generated from the integrated circuit and transmitted to the pressure sensor, a third signal generated from the integrated circuit and transmitted to the fingerprint sensor, and a fourth signal generated from the integrated circuit and transmitted to the antenna may be transmitted during different time intervals. At least two of the first signal, the second signal, the third signal, and the fourth signal may be inverted signals. At least one of the pressure sensor control circuit, the fingerprint sensor control circuit, and the communication circuit may not be integrated with the display drive integrated circuit.

Figure 20A:
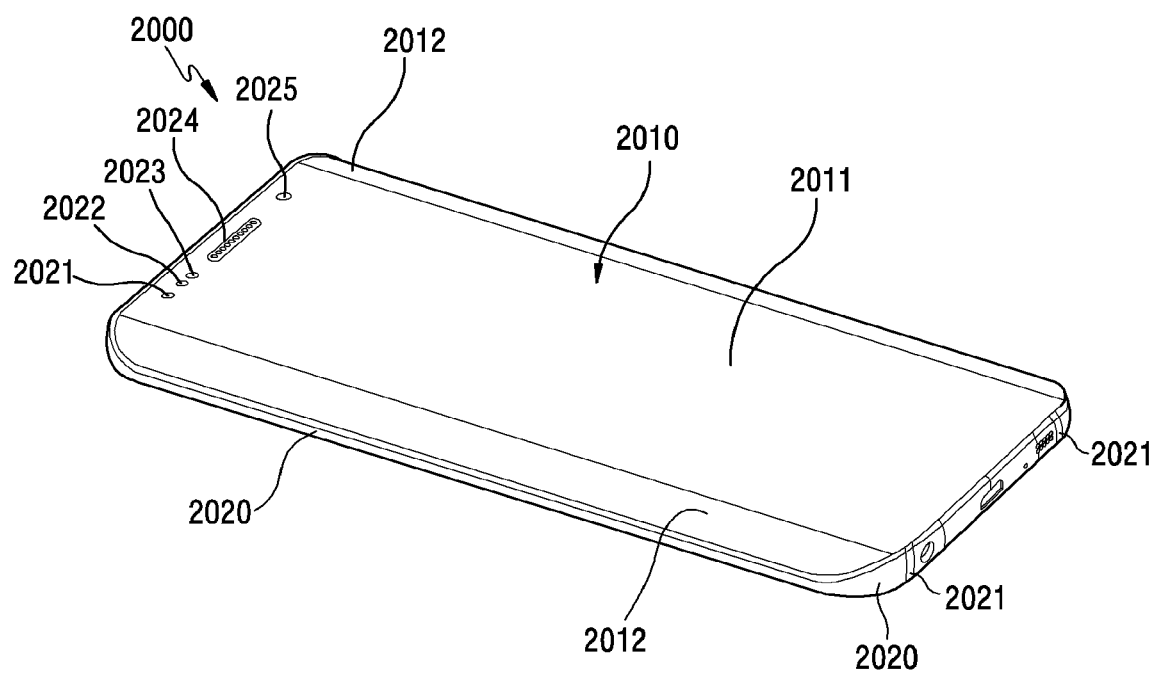
FIG. 20A is a perspective view illustrating the front face of an electronic device according to various embodiments.
Figure 20B:
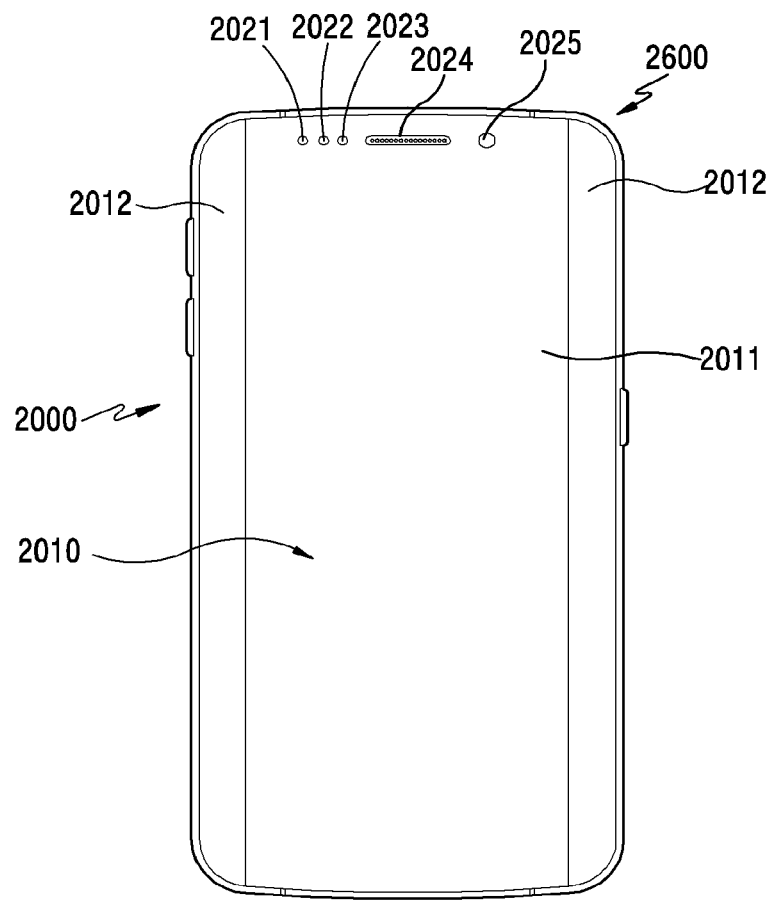
FIG. 20B is a front view illustrating the front face of an electronic device according to various embodiments.

FIG. 20A is a perspective view illustrating the front face of an electronic device according to various embodiments. FIG. 20B is a front view illustrating the front face of an electronic device according to various embodiments.

Referring to FIGS. 20A and 20B, an electronic device 2000 according to various embodiments may be an electronic device which is the same as the electronic devices 101 and 201 illustrated in FIGS. 1 and 2. The electronic device 2000 according to various embodiments may be an electronic device, which is the same as the electronic devices 50, 60, 70, and 80 illustrated in FIGS. 5 to 8. The electronic device 2000 according to various embodiments is different from the electronic device 50 illustrated in FIG. 5 only in the configuration of a display, but is the same as the electronic device 2000 in the remaining configuration, thus descriptions of the remaining configuration will be omitted.

A display 2010 according to various embodiments may include, for example, a Liquid Crystal Display (LCD), a Light-Emitting Diode (LED) display, an Organic Light-Emitting Diode (OLED) display, or a MicroElectroMechanical System (MEMS) display, or an electronic paper display.

The display 2010 according to various embodiments may display various contents (e.g., a text, an image, a video, an icon, or a symbol) to the user. The display 2010 may be provided with a touch screen TSP so as to receive a touch input, a gesture input, a proximity input, or a hovering input that is made using, for example, an electronic pen or a part of the user's body. For example, the touch screen may be disposed between a transparent substrate (e.g., a transparent window) and the display 2010. In this case, the touch screen may include at least one electrode layer. The at least one electrode layer may be formed directly on the face of the transparent substrate in the second direction or the face of the display 2010 in the first direction, or may be formed on a separate film and may be attached to the substrate or the display 2010. For example, the at least one electrode of the touch screen may be disposed inside the display 2010. In this case, the at least one electrode may be disposed between the top and bottom plates of the display 2010, and disposed between the electrodes configured to drive the display 2010. As the touch screen, at least one of an electrostatic-type touch screen, a pressure sensitive-type touch screen, an infrared-type touch screen, and an ultrasonic-type touch screen may be used.

The display 2010 according to various embodiments may include a hard display or a soft (flexible) display. When the display 2010 according to various embodiments is a soft (flexible) display, for example, the display may be a curved display, a bendable display, a foldable display, a rollable display, or a stretchable display. The display 2010 according to various embodiments may include a flat display area 2011 and a curved display area 2012. For example, the display 2010 may be provided with a curved display area 2012 at one side edge and/or the other side edge, with the flat display area 2011 as the center thereof. Also, although not illustrated, in the display 2010 according to various embodiments, curved display areas may be disposed on the upper edge region and/or the lower edge region, or on the upper and lower regions and/or the opposite side regions.

The electronic device 2010 according to various embodiments may be referred to as a "substantially full front display" since a flat and curved display is disposed on the entire first face. In the full front display, the entire front face of the electronic device 2000 may be the display area. As an exception, the area where the receiver 2024 is mounted may not be included in the display area.

The display 2010 according to various embodiments may include other display areas having different pixel densities. The display 2010 may include a first display area (an area in which no functional component is disposed) having a first pixel density and a second display area (an area in which a functional component is disposed) having a second pixel density. The first pixel density may be different from the second pixel density, and the first pixel density may be larger than the second pixel density.

The electronic device 2000 according to various embodiments may include a rim portion 2020. The rim portion 2020 may be disposed so as to be in direct contact with the display area of the display 2010. The display 2010 according to various embodiments may be arranged such that at least a portion of the flat display area 2011 and at least a portion of the curved display area 2012 are respectively in direct contact with the rim portion 2020. For example, the rim portion 2020 may include a synthetic resin or metal frame. For example, when the rim portion is made of a metal frame, at least a portion of the rim portion 2020 may serve as an antenna radiator. When at least a portion of the rim portion 2020 serves as the antenna radiator, the rim portion may include one or more segmented portions 2021 or insulating portions. The segmented portions 2020 and insulating portions may be formed on each of the upper and lower rim portions or each of the opposite side rim portions.

Figure 21:
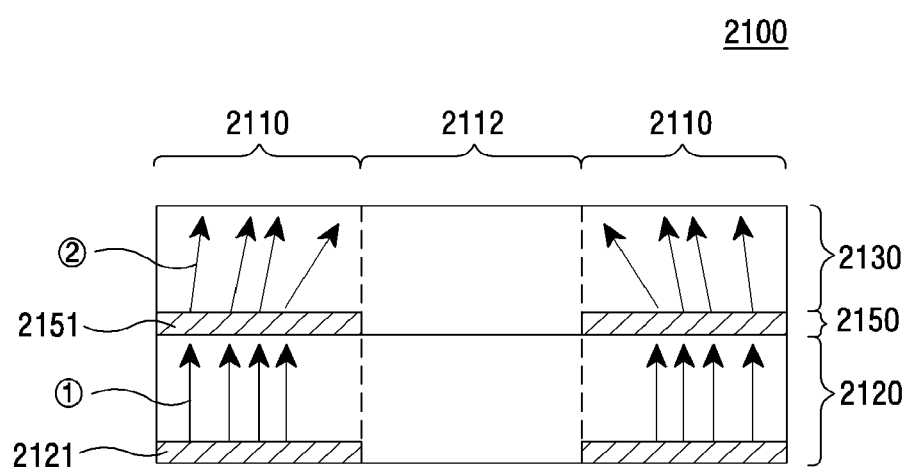
FIG. 21 is a cross-sectional view illustrating an optical structure for correcting an image displayed in the second display area according to various embodiments of the present disclosure.

FIG. 21 is a cross-sectional view illustrating an optical structure for correcting an image displayed in the second display area according to various embodiments of the present disclosure. The electronic device 2100 according to various embodiments may be an electronic device, which is the same as the electronic devices 101 and 201 illustrated in FIGS. 1 and 2. The electronic device 2100 according to various embodiments may be an electronic device, which is the same as the electronic devices 50, 60, 70, and 80 illustrated in FIGS. 5 to 8.

Referring to FIG. 21, first and second displays 2110 and 2112 according to various embodiments may be the first and second displays 7230 and 8230; 7240 and 8240 illustrated in FIGS. 7 and 8.

The electronic device 2100 according to various embodiments may include a display 2120 including first and second display areas 2110 and 2112, a window 2130, and a light path conversion device 2150.

Figure 22:
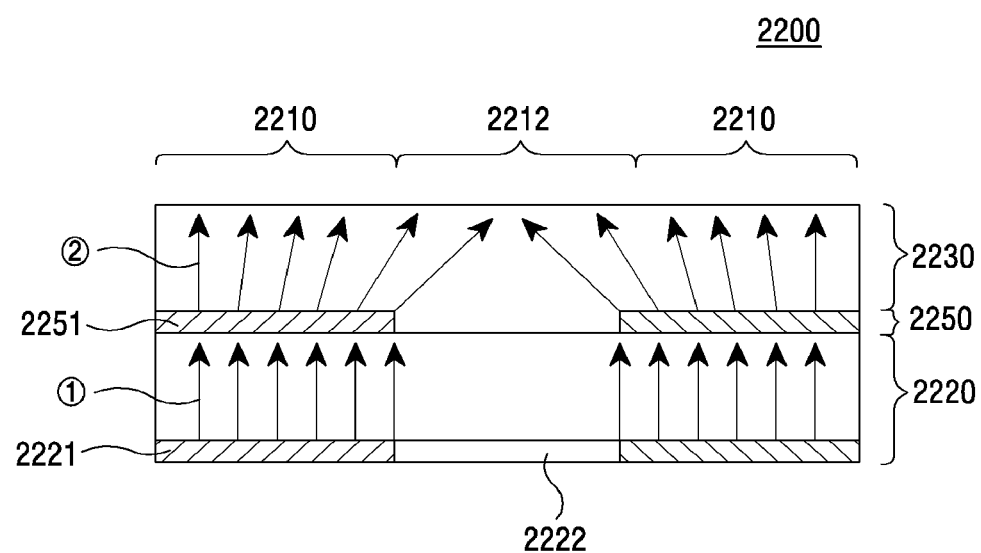
FIG. 22 is a cross-sectional view illustrating an optical structure for correcting an image displayed in the second display area according to various embodiments of the present disclosure.

In the electronic device 2100 according to various embodiments, the light path conversion device 2150 may be disposed between the first display area 2110 and the window 2130. The light path conversion device 2150 according to various embodiments may be configured in a layer shape. The electronic device 2100 according to various embodiments may include an organic light-emitting layer 2121 in the first display area 2110. Light ① of emitted from the organic light-emitting layer 2121 passes through the optical path switching device 2150 and light ② passing through the light path conversion device 2150 is emitted to the first display area 2110, so that an image can be displayed in the display area, except for the second display area 2112. FIG. 22 is a cross-sectional view illustrating an optical structure for correcting an image displayed in the second display area according to various embodiments of the present disclosure.

Referring to FIG. 22, an electronic device 2200 according to various embodiments may be an electronic device, which is the same as the electronic devices 101 and 201, which are illustrated in FIGS. 1 and 2, respectively. The electronic device 2200 according to various embodiments may be an electronic device, which is the same as the electronic devices 50, 60, 70, and 80 illustrated in FIGS. 5 to 8.

First and second displays 2210 and 2212 according to various embodiments may be the first and second displays 7230 and 8230; 7240 and 8240 illustrated in FIGS. 7 and 8.

The electronic device 2200 according to various embodiments may include a display 2220 including first and second display areas 2210 and 2212, a window 2230, and a light path conversion device 2250. The light passing around the second display area can be condensed into the second display area 2212 by the light path conversion device 2250.

In the electronic device 2200 according to various embodiments, the light path conversion device 2250 may be disposed between the first display area 2210 and the window 2230. The light path conversion device 2250 according to various embodiments may be configured in the shape of a layer 2251. The electronic device 2200 according to various embodiments may include an organic light-emitting layer 2221 in the first display area 2210. Light ① emitted from the organic light-emitting layer 2221 passes through the optical path switching device 2250 and light ② passing through the light path conversion device 2250 may be emitted to the first and second display areas 2210 and 2212. The image condensed in the second display area 2212 may be continuous with the image displayed in the first display area. A distorted image of the light passing through the light path conversion device 2250 can be further improved through an image processing process.

Figure 23:
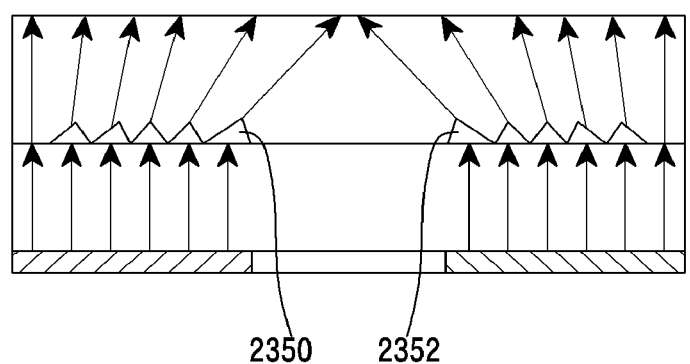
FIG. 23 is a cross-sectional view illustrating an optical structure for correcting an image displayed in the second display area according to various embodiments of the present disclosure.

FIG. 23 is a cross-sectional view illustrating an optical structure for displaying in a second display area according to various embodiments of the present disclosure. An electronic device 2300 according to various embodiments may be an electronic device, which is the same as the electronic devices 101 and 201 illustrated in FIGS. 1 and 2. The electronic device 2300 according to various embodiments may be an electronic device, which is the same as the electronic devices 50, 60, 70, and 80 illustrated in FIGS. 5 to 8. The electronic device 2300 according to various embodiments is different from the electronic device 2200 illustrated in FIG. 22 only in the configuration of a light path conversion device 2350, but is the same as the electronic device 2200 in the remaining configuration, descriptions for the remaining configuration will be omitted.

The light path conversion device 2350 according to various embodiments may be configured in the shape of a lattice pattern.

Figures 24A, 24B:
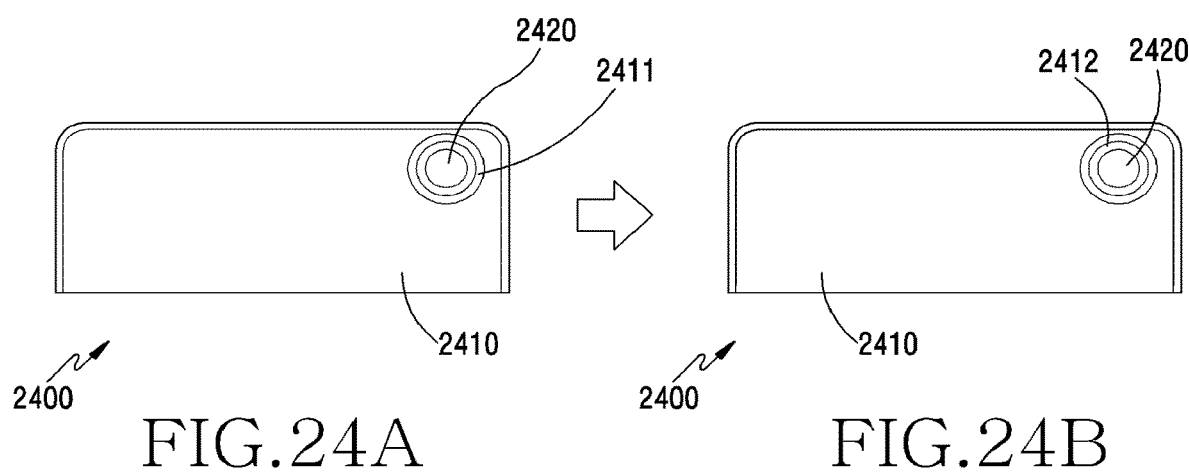
FIGS. 24A and 24B are exemplary views illustrating a state of displaying an image related to the first display area around the second display area according to various embodiments of the present disclosure.

FIGS. 24A and 24B are exemplary views illustrating a state of displaying an image related to the first display area around the second display area according to various embodiments of the present disclosure.

An electronic device 2400 according to various embodiments may display an image associated with the function in the first display area 2410 around the second display area 2420. Although a ring-shaped display area 2411 is exemplified around the second display area 2420 in FIG. 24A, the ring-shaped display area 2411 is not limited to this shape and may be configured in various shapes.

When the camera is disposed under the second display area 2420 according to various embodiments, the second display area 2420 may blink while changing the color thereof to match the remaining time when the camera timer is driven. For example, the function state of the camera may be displayed by implementing the ring-shaped display area 2411 of FIG. 24A as a green color, and after three seconds, implementing the color of the ring-shaped display area 2411 of FIG. 24B as red or another color.

FIGS. 25A and 25B are exemplary views illustrating a state of displaying an image related to the first display area around the second display area according to various embodiments of the present disclosure.

Referring to FIG. 25A, an electronic device 2500 according to various embodiments may display an image associated with the function in the first display area 2510 around the second display area 2520. Although an elliptical display area 2511 is exemplified around the second display area 2520 in FIG. 25B, the elliptical display area 2511 is not limited to this shape and may be configured in various shapes.

When a biometric sensor (HRM) is disposed under the second display area 2520 according to various embodiments and is driven, touched information may be determined and a heartbeat image may be displayed around the touched body part.

FIGS. 26A and 26B are exemplary views illustrating a state at the time of creating a transparent second display area according to various embodiments of the present disclosure.

Referring to FIGS. 26A and 26B, when the second display area is formed as a transparent area in the electronic device according to the various embodiments, the electronic device is capable of providing a switching effect when an opaque or semi-transparent display (FIG. 26A) is switched to a transparent display (FIG. 26B).

FIGS. 27A, 27B, 27C, and 27D are exemplary views schematically illustrating images displayed on the second display area according to various embodiments of the present disclosure.

Figure 27A:
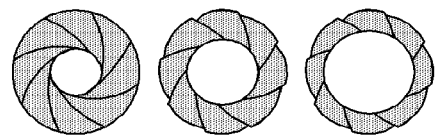
FIGS. 27A, 27B, 27C, and 27D are exemplary views schematically illustrating images displayed on the second display area according to various embodiments of the present disclosure.
Figure 27B:
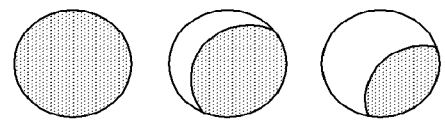
Figure 27C:
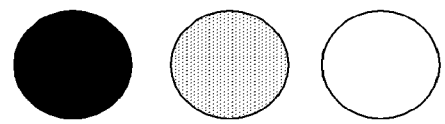
Figure 27D:

Referring to FIG. 27A is a sequential representation of a diaphragm shape to be displayed at the time of camera driving. FIG. 27B sequentially represents displayed shapes during the driving of a camera. FIG. 27C sequential represents displayed shapes that are sequentially turned from a non-transparent image to a transparent image. FIG. 27D sequentially represents displayed shapes during the driving of a biometric sensor.

According to various embodiments of the present disclosure, an electronic device may include: a housing including a first face oriented in a first direction and a second face oriented in a second direction; a transparent cover provided in at least a portion of the first face of the housing; a display disposed between the transparent cover and the second face; a sensor disposed between the display and the second face; and a control circuit electrically connected to the sensor and configured to control the sensor. The display may include: a first area provided with a plurality of pixels capable of displaying a color; and a second area aligned above at least a portion of the sensor so as to pass light acquired from the outside of the electronic device to the sensor.

According to various embodiments of the present disclosure, the second area may not be provided with pixels capable of displaying the color, and an opaque electrode and wiring line may be eliminated, and a transparent electrode and wiring line may be used.

According to various embodiments of the present disclosure, the second area may be a transparent window through which external light passes.

According to various embodiments of the present disclosure, the sensor may be disposed to overlap at least a portion of the first area and at least a portion of the second area when viewed from above the transparent cover.

According to various embodiments of the present disclosure, the sensor may include any one or a combination of a camera, a proximity sensor, an illuminance sensor, a gesture sensor, a motion sensor, a fingerprint recognition sensor, and a biosensor.

According to various embodiments of the present disclosure, the display includes scan wiring lines configured to transmit a first signal to a first pixel and/or a second pixel, and data wiring lines configured to transmit a second signal to the first pixel and/or the second pixel. A form of the first scan wiring line and/or a form of the first data wiring line disposed in the first area is configured to be different from a form of a second scan wiring line and/or a form of a second data wiring line disposed in the second area.

According to various embodiments of the present disclosure, the transparent cover may form substantially the entire first face of the housing, and the transparent cover may be exposed through substantially the entire first face of the housing.

According to various embodiments of the present disclosure, an electronic device may include: a housing including a first face oriented in a first direction and a second face oriented in a second direction; a transparent substrate provided in at least a portion of the first face; a display disposed between the transparent substrate and the second face; a sensor disposed between the display and the second face; and a processor electrically connected to the display and the sensor. The display may include: a first area provided with a first pixel group of one or more pixels; and a second area disposed above at least a portion of the sensor, and provided with a second pixel group of one or more pixels, the second pixel group being configured to be controllable independently of the first pixel group.

According to various embodiments of the present disclosure, the processor may be set to: deactivate at least one pixel of the second pixel group or activate the at least one pixel to a first degree when the sensor is activated, and activate at least one pixel of the second pixel group to a second degree when the sensor is deactivated, and the second degree may be higher than the first degree.

According to various embodiments of the present disclosure, the processor may be set to: activate at least one pixel of the first pixel group and at least one pixel of the second pixel group to be different from each other when the sensor is activated, and activate the at least one pixel of the first pixel group and the at least one pixel of the second pixel group to be equal to each other when the sensor is deactivated.

According to various embodiments of the present disclosure, the at least one pixel of the first pixel group may be formed in a first pixel structure, and the at least one pixel of the second pixel group may be formed in a second pixel structure, the first pixel structure may be configured to pass light acquired from outside the electronic device to a first degree, the second pixel structure may be configured to pass light acquired from outside the electronic device to a second degree, and the second degree may be higher than the first degree.

According to various embodiments of the present disclosure, a number of pixels per unit area (pixels per inch (ppi)) of the second area may be less than a number of pixels per unit area of the first area.

According to various embodiments of the present disclosure, the display may include an active area, which includes an organic light-emitting diode, and an inactive area, which does not include an organic light-emitting diode, and at least a portion of the inactive area of the display is configured to be foldable in the second direction.

According to various embodiments of the present disclosure, the electronic device may further include a pressure sensor disposed between the display and the second face of the housing, and a second control circuit electrically connected to the pressure sensor. The second control circuit may be configured to sense a degree of pressure in the second direction using the pressure sensor.

According to various embodiments of the present disclosure, the electronic device may further include at least one of a fingerprint sensor and an antenna, and at least one of the fingerprint sensor and the antenna is disposed between the transparent substrate and the display, or inside the display.

Hereinafter, a method of correcting an image displayed in a display area will be described with reference to the accompanying drawings.

Figure 28:
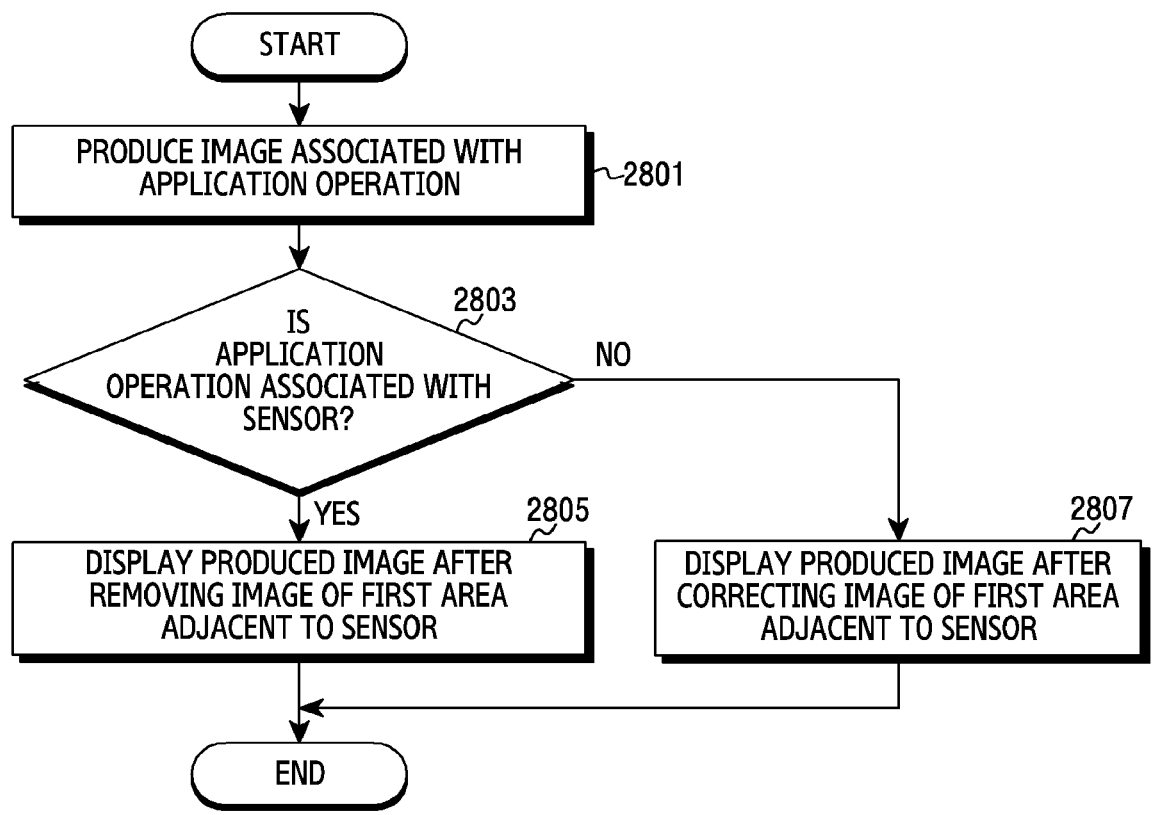
FIG. 28 is a flowchart illustrating a process of displaying an image in an electronic device according to a first embodiment of the present disclosure.

FIG. 28 is a flowchart illustrating a process of displaying an image in an electronic device according to a first embodiment of the present disclosure. For example, the electronic device may be the electronic device 101 illustrated in FIG. 1.

Referring to FIG. 28, in operation 2801, an electronic device 101 (e.g., a processor 120) may generate an image associated with an application operation. For example, the application operation may mean the operation of an application which is currently executed in the electronic device 101.

In operation 2803, the electronic device 101 may determine whether or not the application operation is associated with a sensor. For example, the sensor may be located in the transparent display area of the display (e.g., the display 160). As another example, the sensor may be at least one of a proximity sensor, an illuminance sensor, a biometric sensor, and an image sensor.

According to one embodiment, the electronic device 101 may determine whether or not an application operation is an operation associated with an image sensor. For example, the electronic device 101 may determine whether or not the application operation is an operation to drive or operate the image sensor.

According to one embodiment, the electronic device 101 may determine whether or not the sensor is driven (or operated) based on the voltage level applied to the sensor according to the operation state of the sensor (e.g., a power saving state or an activation state). For example, the voltage level in the power saving state and the voltage level in the activation state are designated, and the voltage level in the power saving state will be lower than the voltage level in the activation state. For example, when a voltage level of the activation state is applied to the sensor, the electronic device 101 may determine that the sensor is driven. As another example, when the voltage level of the power saving state is applied to the sensor, the electronic device 101 may determine that the sensor is not driven.

According to one embodiment, the electronic device 101 may determine whether or not the data input/output pin of the sensor is operating so as to determine whether the sensor is driven (or operated). For example, when an input/output signal is detected from the data input/output pin of the sensor, the electronic device 101 may determine that the sensor is driven. As another example, when the input/output signal is not detected from the data input/output pin of the sensor, the electronic device 101 may determine that the sensor is not driven.

When it is determined that the application operation is associated with the sensor, the electronic device 101 proceeds to operation 2805, otherwise the electronic device 101 may proceed to operation 2807.

When proceeding to operation 2805, the electronic device 101 may display an image produced after removing the image of the first area adjacent to the sensor from the produced image. For example, the first area adjacent to the sensor may be an area located on the sensor in the transparent display area.

According to one embodiment, the electronic device 101 may be configured to identify a transparent display area and an opaque display area in the display area, and then display an image produced after removing the image corresponding to the first area of the identified transparent display area located on the sensor in the produced image. At this time, since the first area from which the image is removed is converted into a transparent state, a sensor located on the rear face may be used.

When proceeding to operation 2807, the electronic device 101 may display an image produced after correcting the image of the first area adjacent to the sensor from the produced image. According to one embodiment, the electronic device 101 may be configured to identify a transparent display area and an opaque display area in the display area, and then display an image produced after correcting the image corresponding to the first area of the transparent display area in the produced image. At this time, since the corrected image is displayed in the first area, the sensor located on the rear face cannot be used.

For example, the electronic device 101 may compensate for an image corresponding to the first area with a high brightness or saturation compared to the original image such that the image corresponding to the first area is not visually awkward.

Figure 29:
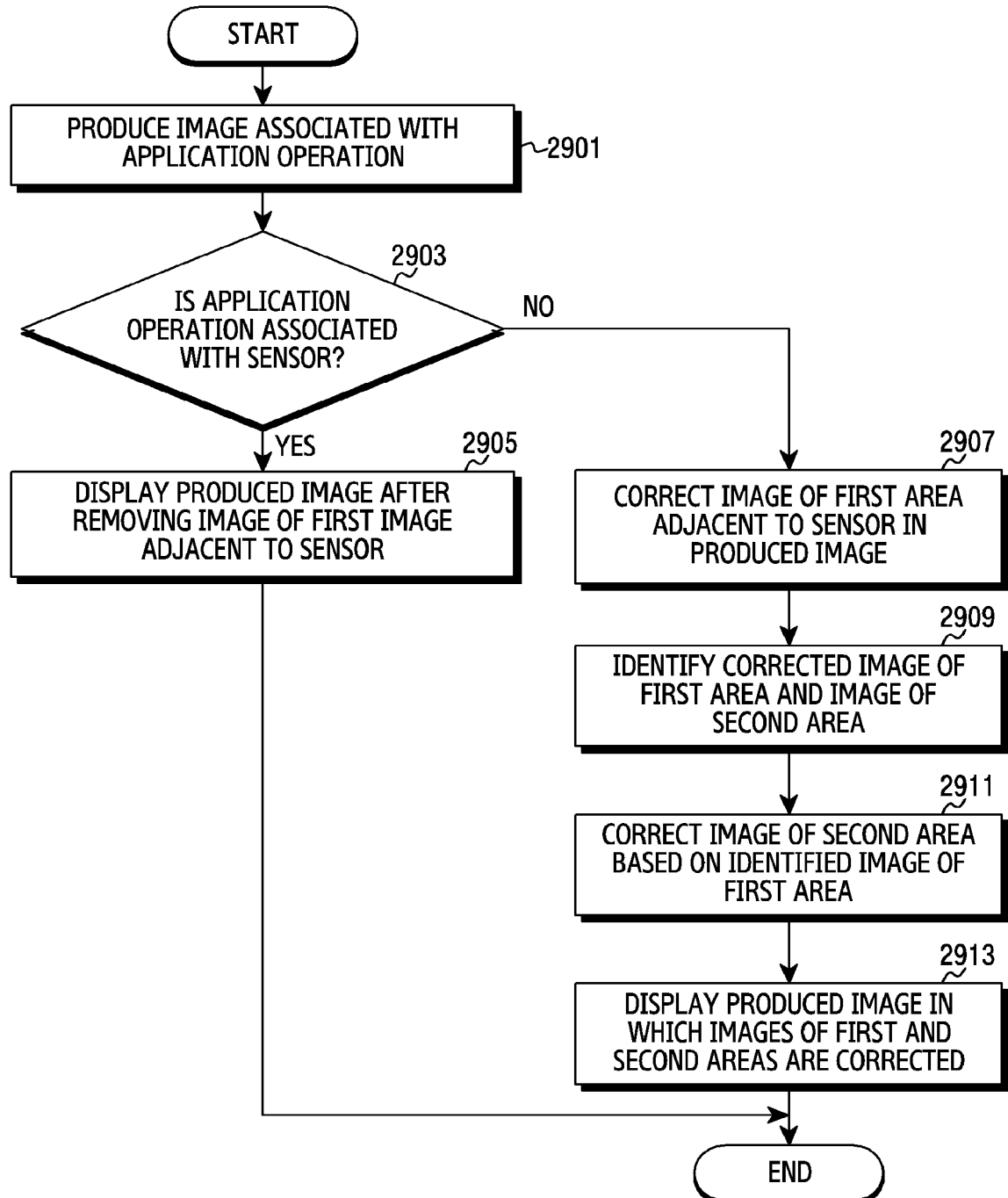
FIG. 29 is a flowchart illustrating a process of displaying an image in an electronic device according to a second embodiment of the present disclosure.

FIG. 29 is a flowchart illustrating a process of displaying an image in an electronic device according to a second embodiment of the present disclosure. For example, the electronic device may be the electronic device 101 illustrated in FIG. 1.

Referring to FIG. 29, in operation 2901, the electronic device 101 (e.g., the processor 120) may generate an image associated with an application operation. For example, the application operation may mean the operation of an application which is currently executed in the electronic device 101.

In operation 2903, the electronic device 101 may determine whether or not the application operation is associated with a sensor. For example, the sensor may be located in the transparent display area of the display (e.g., the display 160). When it is determined that the application operation is associated with the sensor, the electronic device 101 proceeds to operation 2905, otherwise the electronic device 101 may proceed to operation 2907.

When proceeding to operation 2905, the electronic device 101 may display an image produced after removing the image of the first area adjacent to the sensor from the produced image. For example, the first area adjacent to the sensor may be an area located on the sensor in the transparent display area.

According to one embodiment, the electronic device 101 may be configured to identify a transparent display area and an opaque display area in the display area, and then display an image produced after removing the image corresponding to the first area of the identified transparent display area located on the sensor in the produced image. At this time, since the first area from which the image is removed is converted into a transparent state, a sensor located on the rear face may be used.

When proceeding to operation 2907, the electronic device 101 may correct the image of the first area adjacent to the sensor from the produced image. According to one embodiment, the electronic device 101 may be configured to identify a transparent display area and an opaque display area in the display area, and then correct the image corresponding to the first area of the transparent display area in the produced image. For example, the electronic device 101 may compensate for an image corresponding to the first area with a high brightness or saturation compared to the original image such that the image corresponding to the first area is not visually awkward.

In operation 2909, the electronic device 101 may identify the corrected images of first and second areas. For example, the second area may be an area around the first area in the opaque display area. According to one embodiment, the electronic device 101 may identify the optical characteristics of at least one organic light-emitting element located in the first area and the optical characteristics of at least one organic light-emitting element located in the second area.

In operation 2911, the electronic device 101 may correct the image of the second area based on the identified image of the first area. According to one embodiment, the electronic device 101 may adjust the optical characteristics of at least one organic light-emitting element in the second area based on the optical characteristics of the at least one organic light-emitting element in the first area. For example, the electronic device 101 may compensate for the color sense of the image of the first area by adjusting the optical characteristics of at least one organic light-emitting element in the second area such that the image corresponding to the first area is not visually awkward.

In operation 2913, the electronic device 101 may display the produced image in which the images of the first and second areas are corrected. At this time, since the corrected image is displayed in the first area, the sensor located on the rear face cannot be used.

Figure 30:
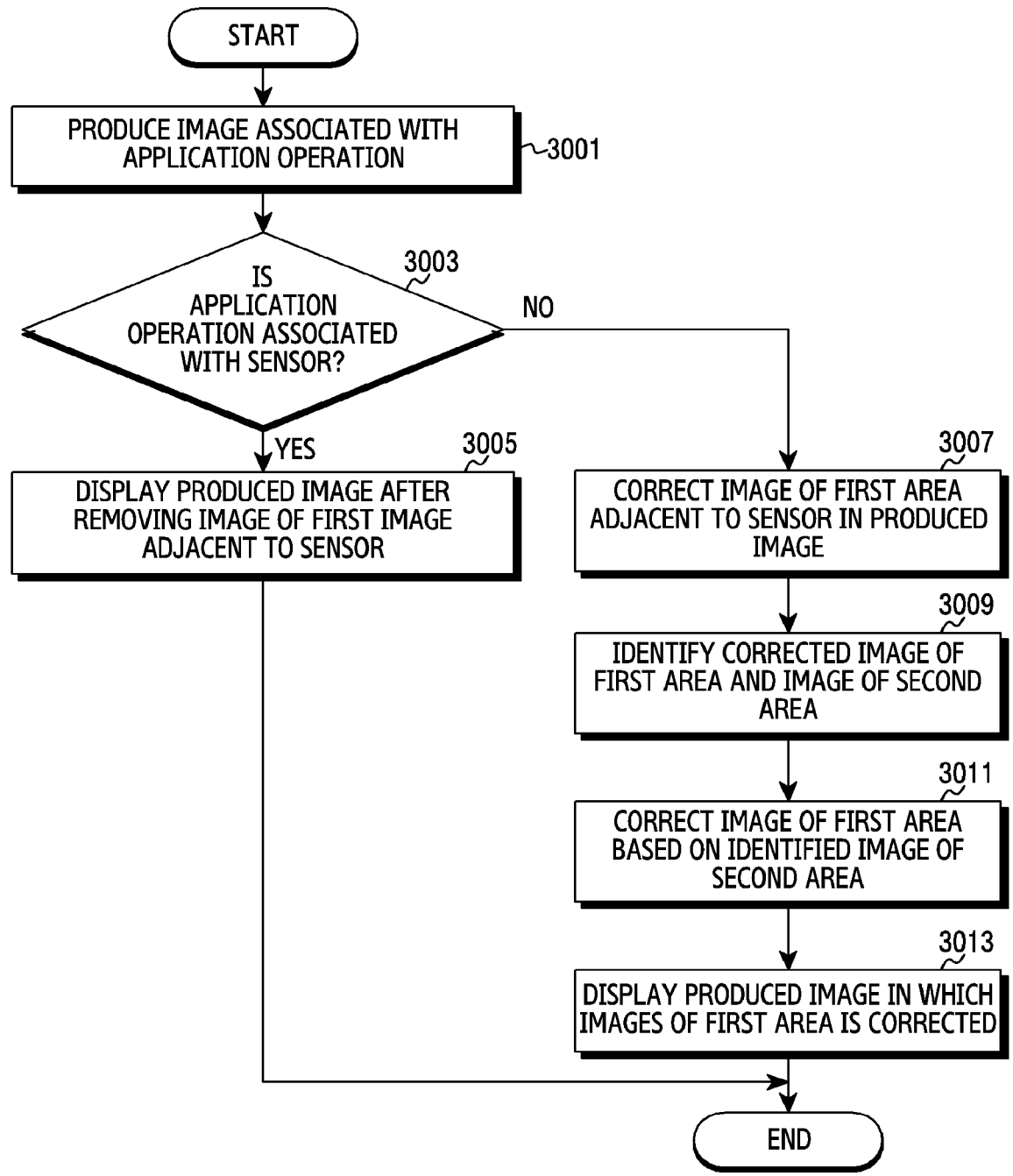
FIG. 30 is a flowchart illustrating a process of displaying an image in an electronic device according to a third embodiment of the present disclosure.

FIG. 30 is a flowchart illustrating a process of displaying an image in an electronic device according to a third embodiment of the present disclosure; For example, the electronic device may be the electronic device 101 illustrated in FIG. 1.

Referring to FIG. 30, in operation 3001, an electronic device 101 (e.g., a processor 120) may generate an image associated with an application operation. For example, the application operation may mean the operation of an application which is currently executed in the electronic device 101.

In operation 3003, the electronic device 101 may determine whether or not the application operation is associated with a sensor. For example, the sensor may be located in the transparent display area of the display (e.g., the display 160). When it is determined that the application operation is associated with the sensor, the electronic device 101 proceeds to operation 3005, otherwise the electronic device 101 may proceed to operation 3007.

When proceeding to operation 3005, the electronic device 101 may display an image produced after removing the image of the first area adjacent to the sensor from the produced image. For example, the first area adjacent to the sensor may be an area located on the sensor in the transparent display area.

According to one embodiment, the electronic device 101 may be configured to identify a transparent display area and an opaque display area in the display area, and then display an image produced after removing the image corresponding to the first area of the identified transparent display area located on the sensor in the produced image. At this time, since the first area from which the image is removed is converted into a transparent state, a sensor located on the rear face may be used.

When proceeding to operation 3007, the electronic device 101 may correct the image of the first area adjacent to the sensor from the produced image. According to one embodiment, the electronic device 101 may be configured to identify a transparent display area and an opaque display area in the display area, and then correct the image corresponding to the first area of the transparent display area in the produced image. For example, the electronic device 101 may compensate for an image corresponding to the first area with a high brightness or saturation compared to the original image such that the image corresponding to the first area is not visually awkward.

In operation 3009, the electronic device 101 may identify the corrected images of first and second areas. For example, the second area may be an area around the first area in the opaque display area. According to one embodiment, the electronic device 101 may identify the optical characteristics of at least one organic light-emitting element located in the first area and the optical characteristics of at least one organic light-emitting element located in the second area.

In operation 3011, the electronic device 101 may correct the image of the first area based on the identified image of the second area. According to one embodiment, the electronic device 101 may adjust the optical characteristics of at least one organic light-emitting element in the first area based on the optical characteristics of the at least one organic light-emitting element in the second area. For example, the electronic device 101 may compensate for the color sense of the image of the first area by adjusting the optical characteristics of at least one organic light-emitting element in the first area such that the image corresponding to the first area is not visually awkward.

In operation 3013, the electronic device 101 may display the produced image in which the image of the first area is corrected. At this time, since the corrected image is displayed in the first area, the sensor located on the rear face cannot be used.

Figure 31:
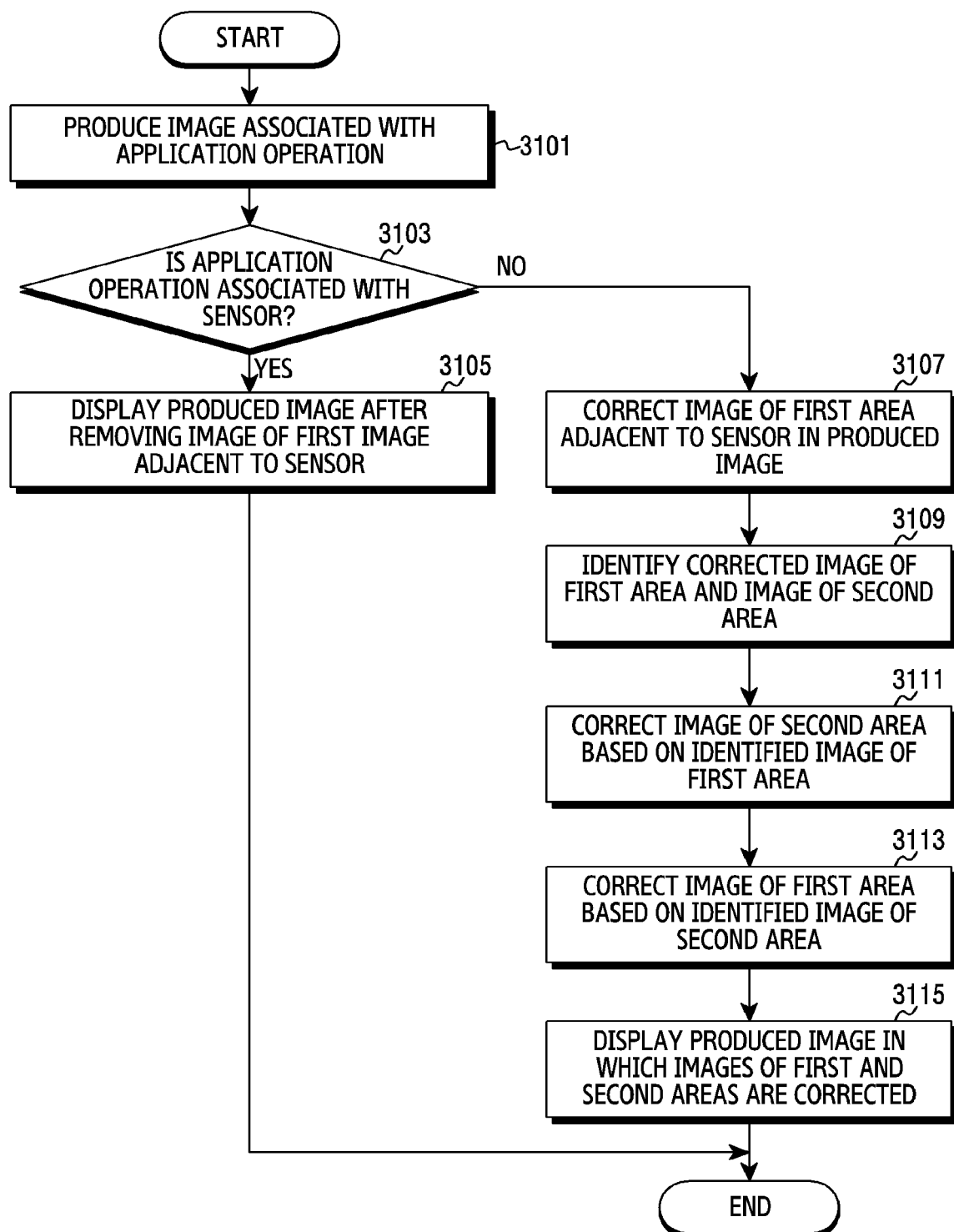
FIG. 31 is a flowchart illustrating a process of displaying an image in an electronic device according to a fourth embodiment of the present disclosure.

FIG. 31 is a flowchart illustrating a process of displaying an image in an electronic device according to a fourth embodiment of the present disclosure; For example, the electronic device may be the electronic device 101 illustrated in FIG. 1.

Referring to FIG. 31, in operation 3101, an electronic device 101 (e.g., a processor 120) may generate an image associated with an application operation. For example, the application operation may mean the operation of an application which is currently executed in the electronic device 101.

In operation 3103, the electronic device 101 may determine whether or not the application operation is associated with a sensor. For example, the sensor may be located in the transparent display area of the display (e.g., the display 160). When it is determined that the application operation is associated with the sensor, the electronic device 101 proceeds to operation 3105, otherwise the electronic device 101 may proceed to operation 3107.

When proceeding to operation 3105, the electronic device 101 may display an image produced after removing the image of the first area adjacent to the sensor from the produced image. For example, the first area adjacent to the sensor may be an area located on the sensor in the transparent display area.

According to one embodiment, the electronic device 101 may be configured to identify a transparent display area and an opaque display area in the display area, and then display an image produced after removing the image corresponding to the first area of the identified transparent display area located on the sensor in the produced image. At this time, since the first area from which the image is removed is converted into a transparent state, a sensor located on the rear face may be used.

When proceeding to operation 3107, the electronic device 101 may correct the image of the first area adjacent to the sensor from the produced image. According to one embodiment, the electronic device 101 may be configured to identify a transparent display area and an opaque display area in the display area, and then correct the image corresponding to the first area of the transparent display area in the produced image. For example, the electronic device 101 may compensate for an image corresponding to the first area with a high brightness or saturation compared to the original image such that the image corresponding to the first area is not visually awkward.

In operation 3109, the electronic device 101 may identify the corrected images of first and second areas. For example, the second area may be a peripheral area around the first area in the opaque display area. According to one embodiment, the electronic device 101 may identify the optical characteristics of at least one organic light-emitting element located in the first area and the optical characteristics of at least one organic light-emitting element located in the second area.

In operation 3111, the electronic device 101 may correct the image of the second area based on the identified image of the first area. According to one embodiment, the electronic device 101 may adjust the optical characteristics of at least one organic light-emitting element in the second area based on the optical characteristics of the at least one organic light-emitting element in the first area.

In operation 3113, the electronic device 101 may correct the image of the first area based on the identified image of the second area. According to one embodiment, the electronic device 101 may adjust the optical characteristics of at least one organic light-emitting element in the first area based on the optical characteristics of the at least one organic light-emitting element in the second area.

For example, the electronic device 101 may compensate for the color sense of the images of the first and second areas by adjusting the optical characteristics of at least one organic light-emitting element in the first area and the optical characteristics of at least one organic light-emitting element in the second area such that the image corresponding to the first area is not visually awkward.

In operation 3115, the electronic device 101 may display the produced image in which the images of the first and second areas are corrected. At this time, since the corrected image is displayed in the first area, the sensor located on the rear face cannot be used.

Figure 32:
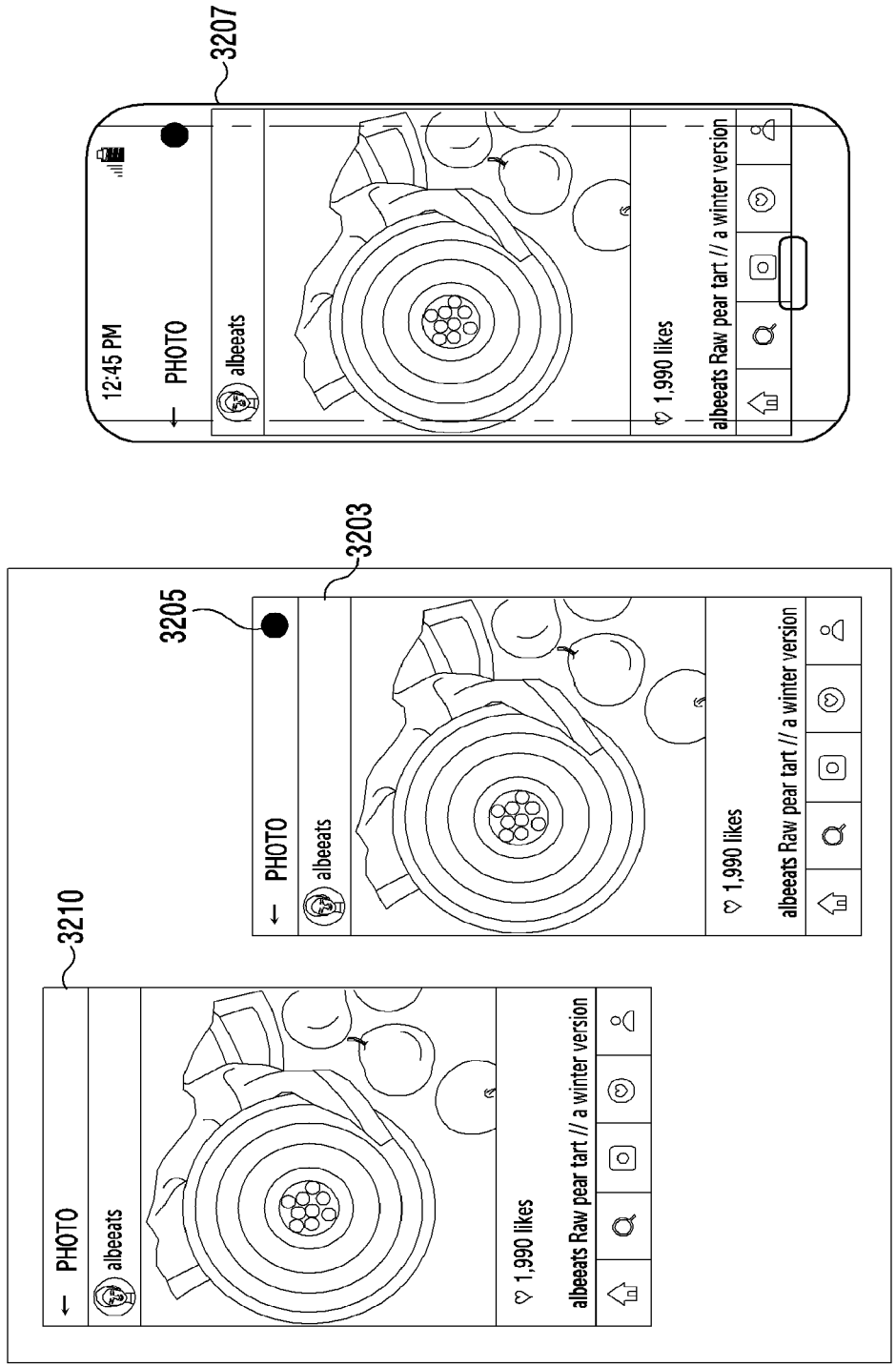
FIG. 32 is a view illustrating an image displayed on the electronic device according to the first embodiment of the present disclosure.

FIG. 32 is a view illustrating an image displayed on the electronic device according to the first embodiment of the present disclosure. For example, the electronic device may be the electronic device 101 illustrated in FIG. 1.

Referring to FIG. 32, the electronic device 101 is capable of producing an image through an application operation, like a screen 3210. When the application operation is associated with a sensor (e.g., an image sensor), the electronic device 101 may remove an image 3205 in the first area where the sensor is located in the produced image, like a screen 3203. Thereafter, the electronic device 101 may display, on the display (e.g., the display 160), the entire image from which the image 3205 in the first area has been removed like a screen 3207.

Figure 33:
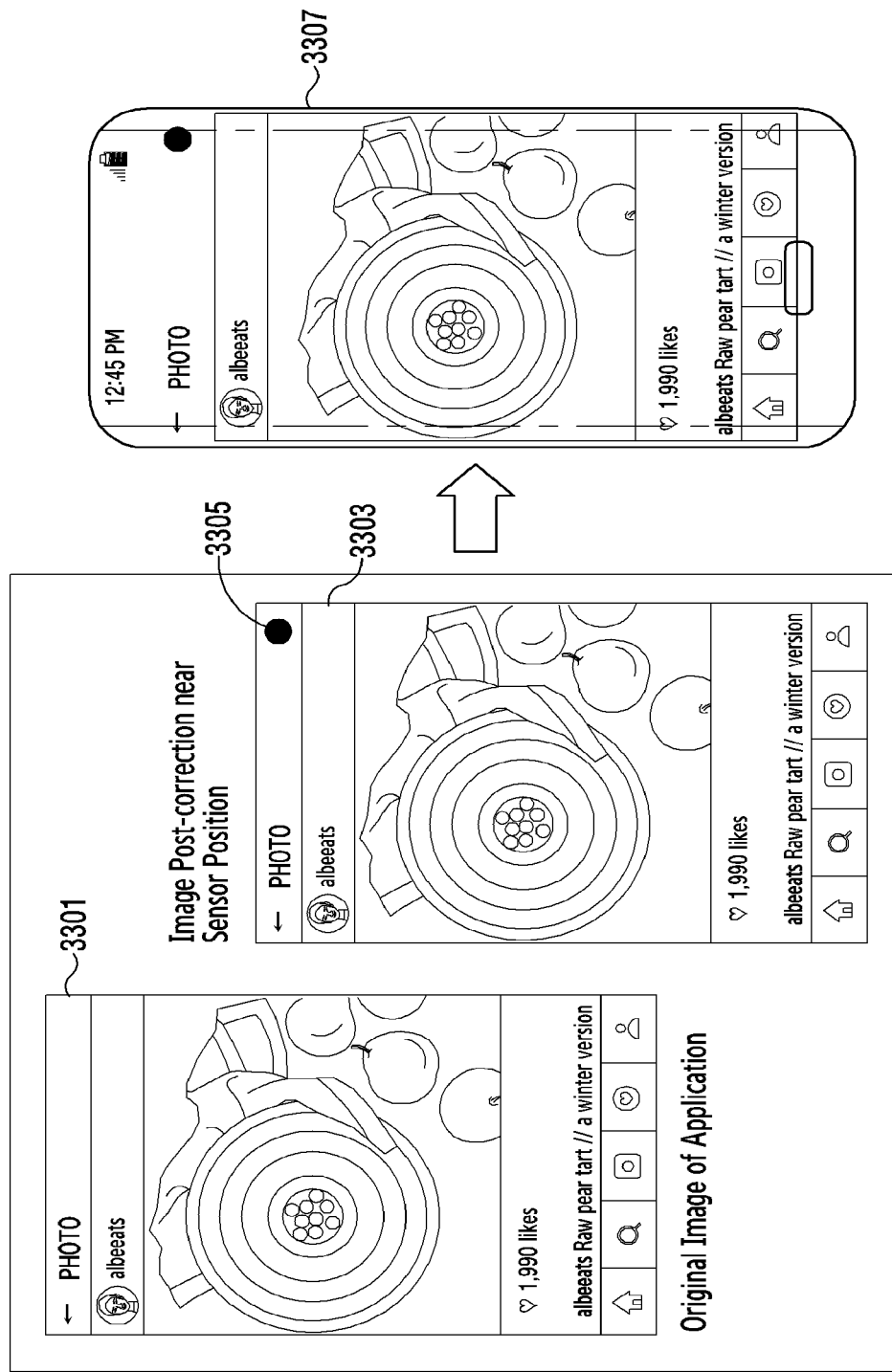
FIG. 33 is a view illustrating an image displayed on the electronic device according to the second embodiment of the present disclosure.

FIG. 33 is a view illustrating an image displayed on the electronic device according to the second embodiment of the present disclosure. For example, the electronic device may be the electronic device 101 illustrated in FIG. 1.

Referring to FIG. 33, the electronic device 101 is capable of producing an image through an application operation, like a screen 3301. When the application operation is not associated with a sensor (e.g., an image sensor), the electronic device 101 may correct an image 3305 in the first area where the sensor is located in the produced image, like a screen 3303.

According to one embodiment, the electronic device 101 may compensate for the image 3305 in the first area with a high brightness or saturation compared to the original image (e.g., the image of the second area) such that the image 3305 in the first area is not visually awkward. For example, the second area may be a peripheral area around the first area in the opaque display area.

According to another embodiment, the electronic device 101 may compensate for the color sense for the image 3305 of the first area by adjusting the optical characteristics of at least one organic light-emitting device in the second area. According to still another embodiment, the electronic device 101 may compensate for the color sense for the image 3305 of the first area by adjusting the optical characteristics of at least one organic light-emitting device in the first area. According to yet another embodiment, the electronic device 101 may compensate for the color sense for the image 3305 of the first area by adjusting the optical characteristics of at least one organic light-emitting device in the first area and the optical characteristics of at least one organic light-emitting device in the second area.

Subsequently, the electronic device 101 may display, on the display (e.g., the display 160), the entire image in which the image 3308 of the first area is corrected, like a screen 3307.

The term "module," as used herein may represent, for example, a unit including a combination of one or two or more of hardware, software, or firmware. The "module" may be, for example, used interchangeably with the terms "unit", "logic", "logical block", "component", or "circuit" etc. The "module" may be the minimum unit of an integrally constructed component or a part thereof. The "module" may be also the minimum unit performing one or more functions or a part thereof. The "module" may be implemented mechanically or electronically. For example, the "module" may include at least one of an application-specific integrated circuit (ASIC) chip, Field-Programmable Gate Arrays (FPGAs) and a programmable-logic device performing some operations known to the art or to be developed in the future.

At least a part of an apparatus (e.g., modules or functions thereof) or method (e.g., operations) according to the present invention may be, for example, implemented as instructions stored in a computer-readable storage medium in a form of a programming module. In case that the instruction is executed by a processor (e.g., processor 120), and the processor may perform functions corresponding to the instructions. The computer-readable storage media may be the memory 130, for instance.

The computer-readable recording medium may include a hard disk, a floppy disk, and a magnetic medium (e.g., a magnetic tape), an optical medium (e.g., a Compact Disc-Read Only Memory (CD-ROM) and a Digital Versatile Disc (DVD)), a Magneto-Optical Medium (e.g., a floptical disk), and a hardware device (e.g., a Read Only Memory (ROM), a Random Access Memory (RAM), a flash memory, etc.). Also, the program instruction may include not only a mechanical language code such as a code made by a compiler but also a high-level language code executable by a computer using an interpreter, etc. The aforementioned hardware device may be constructed to operate as one or more software modules in order to perform operations of the present invention, and vice versa.

The module or programming module according to the present invention may include at least one or more of the aforementioned constituent elements, or omit some of the aforementioned constituent elements, or further include additional other constituent elements. Operations carried out by the module, the programming module or the other constituent elements according to the present invention may be executed in a sequential, parallel, repeated or heuristic method. Also, some operations may be executed in different order or may be omitted, or other operations may be added.

Meanwhile, the exemplary embodiments disclosed in the specification and drawings are merely presented to easily describe the technical contents of the present disclosure and help with the understanding of the present disclosure and are not intended to limit the scope of the present disclosure. Therefore, all changes or modifications derived from the technical idea of the present disclosure as well as the embodiments described herein should be interpreted to belong to the scope of the present disclosure.

What is claimed is:

1. An electronic device comprising:
    a housing;
    a display;
    an image sensor disposed under the display; and
    a control circuit electrically connected to the image sensor and the display;
    wherein the display includes:
        a first display area having a first pixel density, and
        a second display area having a second pixel density being less than the first pixel density, and including a first area with a pixel and a second area without a pixel,
    wherein a transparent wiring line is formed in the second area of the second display area to connect with the pixel in the first area of the second display area, and
    wherein the image sensor is disposed under at least a portion of pixels included in the second display area so as to obtain light through the second area of the second display area.

2. The electronic device of the claim 1, wherein the first display area includes a plurality of pixels with the first pixel density, and one of the plurality of pixels is constituted with a translucent electrode in the first display area.

3. The electronic device of the claim 1, wherein the control circuit is configured to control the display to display an image, representing a function state of the image sensor, in the first display area around the second display area.

4. The electronic device of the claim 1, wherein the pixel of the second display area is deactivated when the image sensor is activated.

5. The electronic device of the claim 1, wherein the image sensor is included in a front camera of the electronic device.

6. The electronic device of the claim 1, wherein the first display area occupies a larger area than the second display area in the display.

7. The electronic device of the claim 1, wherein the electronic device further comprises a board disposed under the display, and wherein the image sensor is disposed between the board and the display.

8. The electronic device of the claim 1, wherein the first pixel density is a first pixel per inch, PPI, of the first display area and the second pixel density is a second PPI of the second display area, and the second PPI of the second display area being less than the first PPI of the first display area.

9. The electronic device of the claim 1, wherein a form of wiring lines across the second display area is different from a form of wiring lines across the first display area.

10. The electronic device of the claim 9, wherein a spacing between the wiring lines in the second display area is wider than a spacing between the wiring lines in the first display area.

11. The electronic device of the claim 1,
    wherein the electronic device further comprises a protective layer disposed on a bottom side of the display,
    wherein the protective layer includes an area where the protective layer is partially removed, and
    wherein the image sensor is disposed in the area.

12. The electronic device of the claim 1, wherein the second area is disposed between adjacent first areas.

13. The electronic device of the claim 1, wherein the control circuit is configured to control the display to display an image by controlling brightness of the image corresponding to the first area of the second display area to be higher than the first display area.

14. The electronic device of the claim 1, wherein the control circuit is configured to control the display to display an image, representing a function state of the image sensor, in a portion of the second display area at a time of the image sensor driving.

* * * * *